US012593703B2

(12) United States Patent
Bishop et al.

(10) Patent No.: US 12,593,703 B2
(45) Date of Patent: Mar. 31, 2026

(54) MOLDED BRIDGE WITH VERTICAL INTERCONNECTS AND METHOD OF MAKING THE SAME

(71) Applicant: Deca Technologies USA, Inc., Tempe, AZ (US)

(72) Inventors: Craig Bishop, Scottsdale, AZ (US); Paul R. Hoffman, San Diego, CA (US)

(73) Assignee: Deca Technologies USA, Inc., Tempe, AZ (US)

( * ) Notice: Subject to any disclaimer, the term of this patent is extended or adjusted under 35 U.S.C. 154(b) by 0 days.

(21) Appl. No.: 19/218,116

(22) Filed: May 23, 2025

(65) Prior Publication Data

US 2025/0385186 A1     Dec. 18, 2025

Related U.S. Application Data

(60) Provisional application No. 63/659,311, filed on Jun. 12, 2024.

(51) Int. Cl.
| | |
|---|---|
| *H01L 23/538* | (2006.01) |
| *H01L 21/48* | (2006.01) |
| *H01L 23/31* | (2006.01) |

(52) U.S. Cl.
CPC ...... *H01L 23/5383* (2013.01); *H01L 21/4857* (2013.01); *H01L 23/3107* (2013.01)

(58) Field of Classification Search
CPC .............................. H01L 23/538; H01L 23/31
See application file for complete search history.

(56) References Cited

U.S. PATENT DOCUMENTS

| | | | |
|---|---|---|---|
| 2015/0340353 A1* | 11/2015 | Starkston | ................ H01L 24/06 438/107 |
| 2018/0102311 A1 | 4/2018 | Shih | |
| 2020/0411443 A1 | 12/2020 | Guo | |

(Continued)

FOREIGN PATENT DOCUMENTS

| | | |
|---|---|---|
| KR | 1020170111677 | 10/2017 |
| KR | 20200014088 | 2/2020 |

*Primary Examiner* — Marlon T Fletcher
*Assistant Examiner* — Christina A Sylvia
(74) *Attorney, Agent, or Firm* — Booth Udall, PLC; Kenneth C. Booth

(57) ABSTRACT

An electronic assembly with a molded bridge, vertical interconnects and encapsulant disposed around vertical interconnects. A first build-up interconnect structure disposed over the encapsulant and the vertical interconnects, through conductive interconnects disposed in a periphery of the molded bridge, a second encapsulant disposed over the molded bridge and around the through conductive interconnects. A second build-up interconnect structure disposed over the molded bridge, the second encapsulant, and the through conductive interconnects. To make the assembly, a first encapsulant is disposed around and over vertical interconnects disposed over a carrier, a first build-up interconnect structure is formed over the first encapsulant and the vertical interconnects, and through conductive interconnects are disposed in a periphery of the vertical interconnects. A second encapsulant is disposed over the first encapsulant, the vertical interconnects and through conductive interconnects to form a molded base, and a second build-up interconnect structure is formed over the molded base.

21 Claims, 25 Drawing Sheets

FIG. 3F

(56)            References Cited

U.S. PATENT DOCUMENTS

| | | | |
|---|---|---|---|
| 2021/0050327 A1 | 2/2021 | Shih | |
| 2021/0335744 A1 | 10/2021 | Olson | |
| 2021/0343547 A1 | 11/2021 | Chang | |
| 2021/0375768 A1 | 12/2021 | Tsou | |
| 2022/0336362 A1* | 10/2022 | Hsieh | H01L 23/31 |
| 2023/0036283 A1* | 2/2023 | Lin | H01L 21/76898 |
| 2023/0069031 A1 | 3/2023 | Wu | |
| 2024/0030147 A1 | 1/2024 | Duan | |

* cited by examiner

MOLDED BRIDGE WITH VERTICAL INTERCONNECTS AND METHOD OF MAKING THE SAME

CROSS-REFERENCE TO RELATED APPLICATIONS

This application claims the benefit of U.S. Provisional Patent No. 63/659,311, entitled "Molded Bridge with Vertical Interconnects and Method of Making the Same," filed on Jun. 12, 2024, the entire disclosure of which is hereby incorporated herein by this reference.

TECHNICAL FIELD

This disclosure concerns molded bridges with vertical interconnects formed as interposers, electronic assemblies formed therefrom, and methods of making the same.

BACKGROUND

Semiconductor devices, packages, substrates, and interposers are commonly found in modern electronic products. Semiconductor devices vary in the number and density of electrical components. Discrete semiconductor devices generally contain one type of electrical component, for example, light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, memories, analog to digital or digital to analog converters, power management and charged-coupled devices (CCDs), as well as microelectromechanical systems (MEMs) devices including digital micro-mirror devices (DMDs).

Semiconductor devices perform a wide range of functions such as signal processing, high-speed calculations, transmitting and receiving electromagnetic signals, controlling electronic devices, storing information, and creating visual projections for displays. Semiconductor devices are found in many fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar, complementary metal oxide semiconductors, and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Production of semiconductor devices may involve a multistep build-up of components, including bridge die. Semiconductor devices are generally manufactured using two complex manufacturing processes, that is, front-end manufacturing, and back-end manufacturing, each involving potentially hundreds of steps. Front-end manufacturing involves the formation of a plurality of semiconductor die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. More recently, back-end manufacturing has been expanded to included emerging technology that allows multiple semiconductor die to be interconnected within a single package or device unit, thereby expanding the conventional definition of back-end technology. The term "semiconductor die" as used herein refers to both the singular and plural form of the words, and accordingly can refer to both a single semiconductor device and multiple semiconductor devices.

One goal of semiconductor manufacturing is to produce smaller semiconductor devices. Smaller devices typically consume less power, have higher performance, can be produced more efficiently, have a smaller form factor, and may be less cumbersome when integrated within wearable electronics, portable handheld communication devices, such as phones, and in other applications. In other words, smaller semiconductor devices may have a smaller footprint, a reduced height, or both, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

SUMMARY

In some aspects, the disclosure relates to an electronic assembly comprising a molded bridge comprising a first encapsulant and a first build-up interconnect structure disposed over and coupled to the first encapsulant, wherein the first build-up interconnect structure comprises a plurality of dielectric layers interleaved with one or more conductive routing layers, through conductive interconnects offset from at least one edge of the molded bridge, a second encapsulant disposed over the molded bridge and around the through conductive interconnects to form a molded base, wherein the second encapsulant further comprises an encapsulant margin of the second encapsulant disposed around a perimeter of the first build-up interconnect structure and laterally disposed between edges of the molded bridge and the through conductive interconnects, a second build-up interconnect structure comprising redistribution layers (RDLs) disposed over the second encapsulant to form a molded interposer, wherein a footprint of the second build-up interconnect structure is larger than, and includes all of, a footprint of the first build-up interconnect structure, a first device disposed over the second build-up interconnect structure, wherein a footprint of the first device is partially over the molded bridge and partially over the through conductive interconnects, and a second device disposed over the second build-up interconnect structure, wherein a footprint of the second device is partially over the molded bridge and partially over the through conductive interconnects.

Particular embodiments comprise one or more of the following features. The molded bridge further comprises one or more of the following: the first build-up interconnect structure comprising conductive traces contacting polyimide; the first build-up interconnect structure comprising conductive traces with encapsulant contacting four sides of the conductive traces; the first build-up interconnect structure coupled with a component within the molded bridge; the first build-up interconnect structure without being coupled to a component within the molded bridge; the first build-up interconnect structure coupled to vertical interconnects within the molded bridge; and the first build-up interconnect structure coupled to encapsulant without being coupled to through conductive interconnects. The molded bridge comprises a component and the component comprises one or more of: a semiconductor chip, a chiplet, an active device, an integrated circuit (IC), a passive device, and integrated passive device (IPD), a deep trench capacitor (DTC), a transformer, a voltage regulator, power management IC (PMIC), a filter, a switch, an amplifier, an interface, a repeater or retimer, a clock, a processor, a controller, an accelerator, a memory, a non-volatile memory (NVM), a bridge, a silicon bridge, a MEMS device, an optical device, an opto-electronic device, a cache and a buffer. The molded bridge comprises a centrally located chip with vertical interconnects disposed around a periphery of the centrally located chip such that the vertical interconnects are disposed along an edge of the molded bridge, or centrally located vertical interconnects with components disposed around a periphery of the vertical interconnects such that the components are disposed at an edge of the molded bridge. The through conductive interconnects of the molded base comprise vertical interconnect blocks (VIBs). The electronic assembly comprises unit specific patterning such that a first misalignment between an edge of the molded bridge and an edge of the electronic assembly is greater than a second misalignment between either the molded bridge and the first build-up interconnect structure or the first build-up interconnect structure and the second build-up interconnect structure. The molded bridge comprises two or more components. The first build-up interconnect structure 70 comprises an additional encapsulant sandwiched between the plurality of dielectric layers interleaved with the plurality of conductive routing layers, wherein: a first set of the plurality of dielectric layers interleaved with the plurality of conductive routing layers is disposed over the first encapsulant, an additional encapsulant is disposed over the first set of the plurality of dielectric layers interleaved with the plurality of conductive routing layers, and a second set of the plurality of dielectric layers interleaved with the plurality of conductive routing layers is disposed over the additional encapsulant. One or more of the first build-up interconnect structure and the second build-up interconnect structure and a lower base build-up interconnect structure comprises one or more planes of one or more thicknesses for signal, ground, and power. The vertical interconnects and the through conductive interconnects comprise copper, and the through conductive interconnects comprise a height in a range of 20-100 micrometers (μm) and a cross-sectional thickness in a range of 3-20 μm. The first device comprises a system on chip (SOC), and the second device comprises a memory or high-bandwidth memory (HBM) device. The molded bridge does not comprise through silicon vias (TSVs).

Aspects of the present disclosure relate to a method of making an electronic assembly, comprising forming a molded RDL bridge comprising vertical interconnects, comprising: providing a first temporary carrier, disposing vertical interconnects over the first temporary carrier, disposing a first encapsulant around the vertical interconnects, forming a first build-up interconnect structure over the first encapsulant and the vertical interconnects, and removing the molded RDL bridge from the first temporary carrier, forming a molded base comprising through conductive interconnects offset from the molded RDL bridge, comprising: providing a second temporary carrier comprising a molded RDL bridge mounting site, disposing through conductive interconnects over the second temporary carrier with the through conductive interconnects offset from the mounting site, mounting the molded RDL bridge to the mounting site, and disposing a second encapsulant over the molded RDL bridge and around the through conductive interconnects, wherein the second encapsulant further comprises an encapsulant margin of the second encapsulant disposed around a perimeter of the molded RDL bridge and laterally disposed between the first build-up interconnect structure and the through conductive interconnects, forming a second build-up interconnect structure comprising redistribution layers (RDLs) over the molded base, wherein a footprint of the second build-up interconnect structure is larger than, and includes all of, a footprint of the first build-up interconnect structure.

Particular embodiments may comprise one or more of the following features. Forming the molded RDL bridge comprising encapsulant: forming the first build-up interconnect structure comprising conductive traces contacting polyimide, forming the first build-up interconnect structure comprising conductive traces contacting encapsulant without contacting polyimide, forming the first build-up interconnect structure coupled with a component within the molded bridge, forming the first build-up interconnect structure without being coupled to a component within the molded bridge, forming the first build-up interconnect structure coupled to vertical interconnects within the molded bridge, and forming the first build-up interconnect structure coupled to encapsulant without being coupled to vertical interconnects. Forming the molded bridge without through silicon vias (TSVs). Disposing a first device over the molded base and the second build-up interconnect, wherein a footprint of the first device is partially over the molded bridge and partially over the through conductive interconnects, and disposing a second device over the molded base and the second build-up interconnect, wherein a footprint of the second device is partially over the molded bridge and partially over the through conductive interconnects. Disposing a first device and a second device over the second build-up interconnect structure, wherein the first device and the second device comprise one or more of a system on chip (SOC) device, a memory device, a high bandwidth memory (HBM) device, a sensor, a semiconductor chip, a chiplet, an active device, an integrated circuit (IC), a passive device, and integrated passive device (IPD), a deep trench capacitor (DTC), a transformer, a voltage regulator, power management IC (PMIC), a filter, a switch, an amplifier, an interface, a repeater or retimer, a clock, a processor, a controller, an accelerator, a memory, a non-volatile memory (NVM), a bridge (e.g., Si bridge), a MEMS device, an optical device, an opto-electronic device, a cache and a buffer. The molded bridge comprises a component and the component comprises one or more of: a semiconductor chip, a chiplet, an active device, an integrated circuit (IC), a passive device, and integrated passive device (IPD), a deep trench capacitor (DTC), a transformer, a voltage regulator, power management IC (PMIC), a filter, a switch, an amplifier, an interface, a repeater or retimer, a clock, a processor, a controller, an accelerator, a memory, a non-volatile memory (NVM), a bridge, a silicon bridge, a MEMS device, an optical device, an opto-electronic device, a cache and a buffer. The molded bridge comprises: a centrally located chip with vertical interconnects disposed around a periphery of the centrally located chip such that the vertical interconnects are disposed along an edge of the molded bridge, or centrally located vertical interconnects with components disposed around a periphery of the vertical interconnects such that the components are disposed at an edge of the molded bridge. The through conductive interconnects 120 of the molded base comprise vertical interconnect blocks (VIBs). The electronic assembly comprises unit specific patterning such that a first misalignment between an edge of the molded bridge and an edge of the electronic assembly is greater than a second misalignment between either the molded bridge and the first build-up interconnect structure or the first build-up interconnect structure and the second build-up interconnect structure. Disposing at least one of the first device and the second device at least partially over the molded bridge and partially over the through conductive interconnects such that a footprint of at least one of the first device and the second device is at least partially over the molded bridge and partially over the through conductive interconnects.

The foregoing and other aspects, features, applications, and advantages will be apparent to those of ordinary skill in the art from the specification, drawings, and the claims. Unless specifically noted, it is intended that the words and phrases in the specification and the claims be given their plain, ordinary, and accustomed meaning to those of ordinary skill in the applicable arts. The inventors are fully aware that they can be their own lexicographer if desired. The inventors expressly elect, as their own lexicographers, to use only the plain and ordinary meaning of terms in the specification and claims unless they clearly state otherwise and then further, expressly set forth the "special" definition of that term and explain how it differs from the plain and ordinary meaning. Absent such clear statements of intent to apply a "special" definition, it is the inventors' intent and desire that the simple, plain and ordinary meaning to the terms be applied to the interpretation of the specification and claims.

The inventors are also aware of the normal precepts of English grammar. Thus, if a noun, term, or phrase is intended to be further characterized, specified, or narrowed in some way, then such noun, term, or phrase will expressly include additional adjectives, descriptive terms, or other modifiers in accordance with the normal precepts of English grammar. Absent the use of such adjectives, descriptive terms, or modifiers, it is the intent that such nouns, terms, or phrases be given their plain, and ordinary English meaning to those skilled in the applicable arts as set forth above.

Further, the inventors are fully informed of the standards and application of the special provisions of 35 U.S.C. § 112(f). Thus, the use of the words "function," "means" or "step" in the Detailed Description or Description of the Drawings or claims is not intended to somehow indicate a desire to invoke the special provisions of 35 U.S.C. § 112(f), to define the invention. To the contrary, if the provisions of 35 U.S.C. § 112(f) are sought to be invoked to define the inventions, the claims will specifically and expressly state the exact phrases "means for" or "step for", and will also recite the word "function" (i.e., will state "means for performing the function of [insert function]"), without also reciting in such phrases any structure, material or act in support of the function. Thus, even when the claims recite a "means for performing the function of . . . " or "step for performing the function of . . . ," if the claims also recite any structure, material or acts in support of that means or step, or that perform the recited function, then it is the clear intention of the inventors not to invoke the provisions of 35 U.S.C. § 112(f). Moreover, even if the provisions of 35 U.S.C. § 112(f) are invoked to define the claimed aspects, it is intended that these aspects not be limited only to the specific structure, material or acts that are described in the preferred embodiments, but in addition, include any and all structures, materials or acts that perform the claimed function as described in alternative embodiments or forms of the disclosure, or that are well known present or later-developed, equivalent structures, material or acts for performing the claimed function.

DETAILED DESCRIPTION

Figure 1:
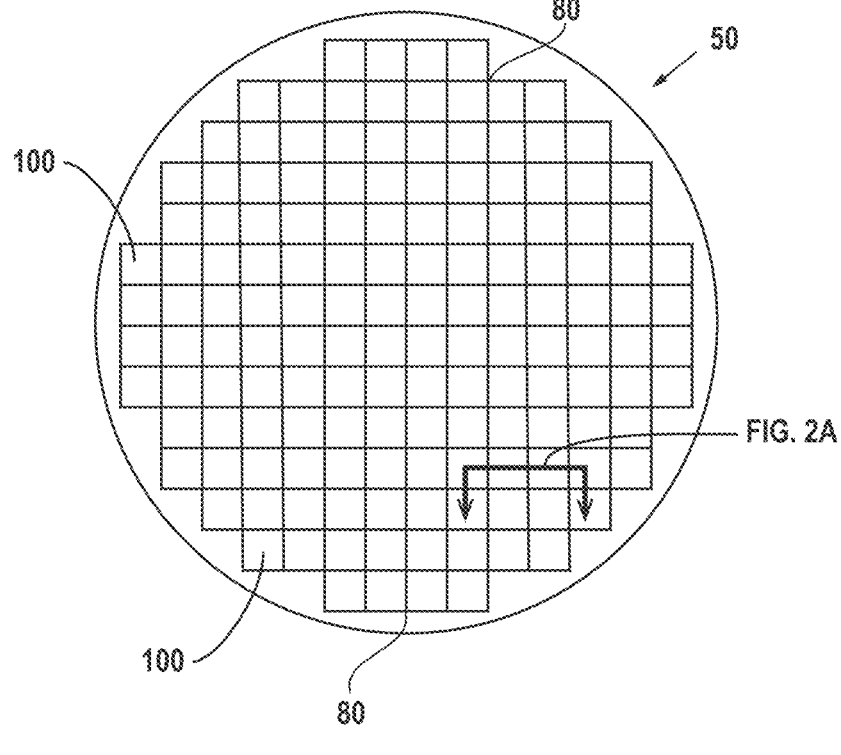
FIG. 1 illustrates a top or plan view of a plurality of molded bridges or molded RDL bridges.

This disclosure relates to fully molded semiconductor structures, devices, and packages, and more particularly to a fully molded bridge interposer. In some instances, the fully molded bridge interposer may comprise one or more of an embedded build-up interconnect structure and an embedded component.

The fully molded semiconductor structures or fully molded bridge interposers (and method for making and using the same) may comprise, or provide: (i) a simplified supply chain, (ii) when compared with a conventional interposer, removing a need for an expensive large silicon die with through silicon vias (TSVs), which can be very large die that are very expensive because (at least in part) because of TSV technology, (iii) when compared with Intel's Embedded Multi-die Interconnect Bridge (EMIB) technology, providing the advantage of not requiring a specialized substrate technology, thus enabling or facilitating the use of a low-cost substrate, (iv) improved electrical performance from using plated Cu Post vs. TSVs, (v) have available ultra-high density connections (of or about a 10 μm area array bond pad pitch) where bridge die are embedded, and high density (of or about a 20 μm area array bond pad pitch) elsewhere, and (vi) high density connections between bridge die and other devices or packages.

At least some of the above advantages are available at least in part by using unit specific patterning (such as patterning (custom lithography) and build up interconnect structures such as a frontside build-up interconnect structure, which is also known under the trademark "Adaptive Patterning" by Deca Technologies USA, Inc.) with respect to the bridge die. Unit specific patterning: (i) allows high-speed chip attach for bridge die and unit specific patterning will ensure alignment for high density interconnects between an interposer or molded interposer and attached devices, (ii) aligns vias to Cu Studs allowing largest contact vias with smallest studs (fine pitch), (iii) with respect to an interposer, makes the molded bridge interposer including a frontside build-up interconnect structure much cheaper that a large interposer die, (iv) with respect to EMIB, vias can be large compared to stud size and capture pad size, lithography defined vias (not laser drilled), (v) allows connections between devices inside the molded bridge interposer with unit specific patterning or routing to compensate for die shift (including bridge die shift) between embedded devices, which may include memory controllers, voltage regulators, SERDES, etc., and (vi) make embedding active devices more useful.

This disclosure, its aspects and implementations, are not limited to the specific package types, material types, or other system component examples, or methods disclosed herein. Many additional components, manufacturing and assembly procedures known in the art consistent with semiconductor manufacture and packaging are contemplated for use with particular implementations from this disclosure. Accordingly, for example, although particular implementations are disclosed, such implementations and implementing components may comprise any components, models, types, materials, versions, quantities, and/or the like as is known in the art for such systems and implementing components, consistent with the intended operation.

The word "exemplary," "example" or various forms thereof are used herein to mean serving as an example, instance, or illustration. Any aspect or design described herein as "exemplary" or as an "example" is not necessarily to be construed as preferred or advantageous over other aspects or designs. Furthermore, examples are provided solely for purposes of clarity and understanding and are not meant to limit or restrict the disclosed subject matter or relevant portions of this disclosure in any manner. It is to be appreciated that a myriad of additional or alternate examples of varying scope could have been presented, but have been omitted for purposes of brevity.

Where the following examples, embodiments and implementations reference examples, it should be understood by those of ordinary skill in the art that other manufacturing devices and examples could be intermixed or substituted with those provided. In places where the description above refers to particular embodiments, it should be readily apparent that a number of modifications may be made without departing from the spirit thereof and that these embodiments and implementations may be applied to other technologies as well. Accordingly, the disclosed subject matter is intended to embrace all such alterations, modifications and variations that fall within the spirit and scope of the disclosure and the knowledge of one of ordinary skill in the art.

Semiconductor devices are generally manufactured using two complex manufacturing processes: front-end manufacturing and back-end manufacturing. Through front-end manufacturing passive and active components are formed over the surface of the semiconductor wafer by a series of process steps including doping, deposition, photolithography, etching, and planarization. Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, such as by a stripping process, leaving behind a patterned layer. Alternatively, some types of materials are patterned by directly depositing the material into the areas or voids formed by a previous deposition/etch process using techniques such as electroless and electrolytic plating.

Patterning is the basic operation by which portions of the photoresist material are partially removed, so as to provide a pattern or electroplating template for the subsequent formation of structures, such as patterning redistribution layers (RDLs), under bump mentalization (UBM), copper posts, vertical interconnects, or other desirable structures. Portions of the semiconductor wafer can be removed using photolithography, photomasking, masking, oxide or metal removal, photography and stenciling, and microlithography. Photolithography includes forming a pattern in reticles or a photomask and transferring the pattern into the surface layers of the semiconductor wafer. Photolithography forms the horizontal dimensions of active and passive components on the surface of the semiconductor wafer in a two-step process. First, the pattern on the reticle, masks, or direct write imaging design file are transferred into a layer of photoresist. Photoresist is a light-sensitive material that undergoes changes in structure and properties when exposed to light. The process of changing the structure and properties of the photoresist occurs as either negative-acting photoresist or positive-acting photoresist. Second, the photoresist layer is transferred into the wafer surface. The transfer occurs when etching removes or electroplating adds the portion of the top layers of semiconductor wafer not covered by the photoresist. The chemistry of photoresists is such that the photoresist remains substantially intact and resists removal by chemical etching solutions while the portion of the top layers of the semiconductor wafer not covered by the photoresist is removed by etching or a layer is added by electroplating. The process of forming, exposing, and removing the photoresist, as well as the process of removing or adding a portion of the semiconductor wafer can be modified according to the particular resist used and the desired results. Negative or positive tones resist can be designed for solvent or base develop solutions.

In negative-acting photoresists, photoresist is exposed to light and is changed from a soluble condition to an insoluble condition in a process known as polymerization. In polymerization, unpolymerized material is exposed to a light or energy source and polymers form a cross-linked material that is etch-resistant. In most negative resists, the polymers are polyisopremes. Removing the soluble portions (i.e. the portions not exposed to light) with chemical solvents or base developers leaves a hole in the resist layer that corresponds to the opaque pattern on the reticle. A mask whose pattern exists in the opaque regions is called a clear-field mask.

In positive-acting photoresists, photoresist is exposed to light and is changed from relatively nonsoluble condition to much more soluble condition in a process known as photo-solubilization. In photosolubilization, the relatively insoluble resist is exposed to the proper light energy and is converted to a more soluble state. The photosolubilized part of the resist can be removed by a solvent or a base in the development process. The basic positive photoresist polymer is the phenol-formaldehyde polymer, also called the phenol-formaldehyde novolak resin. Removing the soluble portions (i.e. the portions exposed to light) with chemical solvents or base developers leaves a hole in the resist layer that corresponds to the transparent pattern on the reticle. A mask whose pattern exists in the transparent regions is called a dark-field mask.

After removal of the top portion of the semiconductor wafer not covered by the photoresist, the remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface can be beneficial or required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. Alternatively, mechanical abrasion without the use of corrosive chemicals is used for planarization. In some embodiments, purely mechanical abrasion is achieved by using a belt grinding machine, a standard wafer backgrinder, or other similar machine. The combined mechanical action of the abrasive and corrosive action of the chemical removes any irregular topography, resulting in a uniformly flat surface.

Back-end manufacturing refers to cutting or singulating the finished wafer into the individual semiconductor die and then packaging the semiconductor die for structural support and environmental isolation. To singulate the semiconductor die, the wafer can be cut along non-functional regions of the wafer called saw streets or scribes. The wafer is singulated using a laser cutting tool, laser silicon lattice disruption process or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, redistribution layers, or wirebonds. An encapsulant or other molding material is deposited over the package to provide physical support and electrical isolation. The finished package is then inserted into an electrical system and the functionality of the semiconductor device is made available to the other system components.

Back-end manufacturing as disclosed herein also does more than merely packaging an embedded device or the semiconductor die for structural support and environmental isolation. The packaging described herein further provides non-monolithic electrical interconnection of die for increased functionality & performance. Previously, nearly all advanced semiconductor die were monolithic systems on chips (SoCs) where all electrical interconnect occurred on the silicon wafer during front-end processing. Now, however, work that was traditionally the domain of front-end domain work may be handled or moved to the back-end manufacturing, allowing many semiconductor die chiplets to be connected with packaging technology to form a chiplet-based SiP (system in package) or heterogeneous integration (which is non monolithic) and provides a composite package with greater functionality. The chiplet approach may also decrease waste from defects, increase production efficiency, reliability, and performance.

The electrical system can be a stand-alone system that uses the semiconductor device to perform one or more electrical functions. Alternatively, the electrical system can be a subcomponent of a larger system. For example, the electrical system can be part of a portable hand-held electronic device, such as smart phone, a wearable electronic device, or other video or electronic communication device. Additionally, the electrical system may comprise a graphics component, network interface component, or other signal processing component that can be inserted into a computer or electronics device and may assist with such functions as mobile computing, artificial intelligence, and autonomous functions such as autonomous driving. The semiconductor package can include microprocessors, memories, application specific integrated circuits (ASIC), logic circuits, analog circuits, RF circuits, discrete devices, or other semiconductor die or electrical components. Miniaturization and weight reduction can be beneficial or essential for the products to be accepted by the market. The distance between semiconductor devices must be decreased to achieve higher density.

By combining one or more semiconductor devices, structures, or packages with fan-out technology, manufacturers can incorporate multiple components or elements into more highly compact and integrated electronic devices and systems. Chiplets can each be manufactured in fabrications optimized for their type of wafer—e.g. CMOS, or analog, or memory, or other type of wafer. Because the semiconductor devices include sophisticated functionality, electronic devices can be manufactured less expensively and as part of a streamlined manufacturing process. The resulting devices are less likely to fail and less expensive to manufacture resulting in a lower cost for consumers.

FIG. 1 illustrates a top or plan view of a plurality of molded bridges or molded RDL bridges, 100 being formed or disposed over a first temporary carrier 50 and separated by saw streets 80. FIGS. 2A-5B, included and discussed further below, illustrate cross-sectional side views of two of the molded bridges 100 being formed, as taken along detail line labeled FIG. 2A.

Figures 2A, 2B:
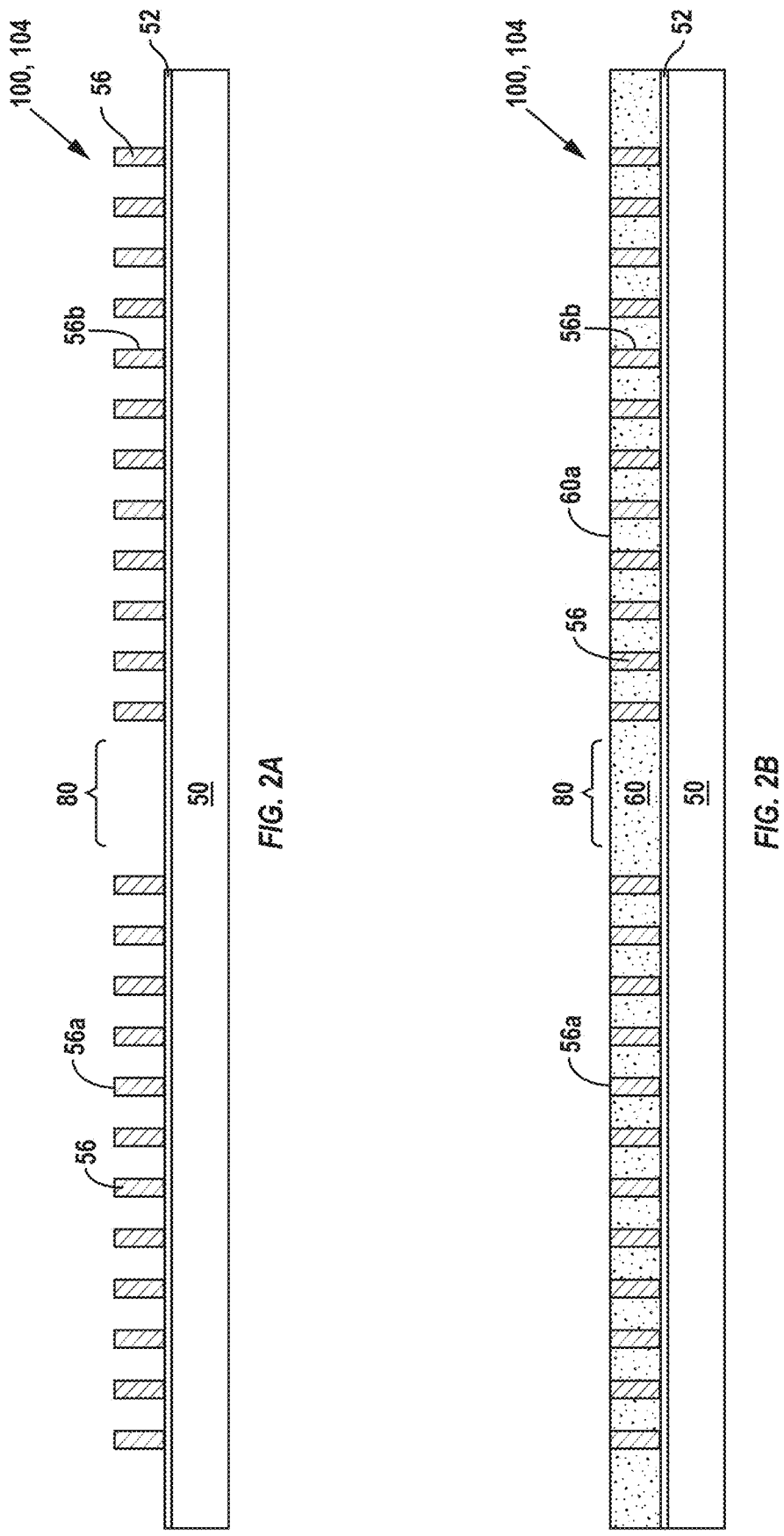
FIGS. 2A-2C illustrate cross-sectional side views of the formation of two side-by-side molded bridges without a chip or component.

FIG. 2A, illustrates a cross-sectional side view of the formation of two side-by-side molded bridges 100, as taken along the detail line 2A shown in FIG. 1. FIG. 2A illustrates providing a first temporary carrier 50. The first temporary carrier 50 may comprise base materials such as metal, silicon, polymer, polymer composite, ceramic, perforated ceramic, glass, glass epoxy, stainless steel, mold compound, mold compound with filler, or other suitable low-cost, rigid material or bulk semiconductor material for structural support. A release tape or adhesion layer 52 may be disposed over the temporary carrier 50. Adhesion layer 52 may comprise thermal epoxy, epoxy resin, B-stage epoxy laminating film, ultraviolet (UV) B-stage film adhesive layer, UV B-stage film adhesive layer including acrylic polymer, thermo-setting adhesive film layer, a suitable wafer backside coating, backgrind tape, acrylate based adhesive, epoxy-acrylate adhesive, or a PI-based adhesive. When a UV release tape is used with temporary carrier 50, the carrier 50 may comprise one or more materials, such as glass, that are transparent or translucent to UV light. When a thermal release is used with a temporary carrier 50, the carrier 50 may comprise opaque materials. The release tape or adhesion layer 52 may be a film or laminate and may also be applied by spin coating or other suitable process. FIG. 2A further illustrates forming vertical interconnects 56 formed or disposed over the adhesion layer 52 and first temporary carrier 50. The vertical interconnects 56 comprise an end, a top, an exposed end or planarized end 56a, and a side or sidewall 56b, and can be formed over the adhesion layer 52 and temporary carrier 50 as conductive columns, pillars, posts, bumps, or studs that are formed of copper or other suitable conductive material. Vertical interconnects 56 can be formed using patterning and metal deposition processes such as printing, PVD, CVD, sputtering, electrolytic plating, electroless plating, evaporation, or other suitable metal deposition process. Vertical interconnects 56 can include one or more layers of Al, Cu, Sn, Ni, Au, Ag, palladium (Pd), or other suitable electrically conductive material and can include one or more layers. In some embodiments, copper may be used in a plating process to form vertical interconnects 56 wherein the vertical interconnects 56 are plated up from or on top of a seed layer, portions of which are later removed, that is not shown in FIG. 2A. Saw streets 80 disposed on temporary carrier 50 are depicted as separating the molded bridges 100.

FIG. 2B, continuing from FIG. 2A, illustrates forming two molded bridges 100, 104 comprising vertical interconnects 56, by disposing a single first encapsulant 60 around, and contacting side surfaces 56b of, the vertical interconnects 56 in a single step. First encapsulant 60 may be deposited around the vertical interconnects 56 and over the adhesion layer 52 and temporary carrier 50 using a paste printing, compression molding, transfer molding, liquid encapsulant molding, lamination, vacuum lamination, spin coating, or other suitable application method. The first encapsulant 60 can be a polymer composite material, such as epoxy resin with filler commonly referred to as molding compound, epoxy acrylate with filler, or other polymer with proper filler. According to some embodiments, the first encapsulant 60 may comprise the same or similar materials as subsequently disclosed for a second encapsulant 124 and/or additional encapsulants 62, 64, and more. First encapsulant 60 may be a material suitable for planarizing such as through chemical mechanical planarizing (CMP), diamond cutter planarizing, or grinding as described following for second encapsulant 124. The first encapsulant 60 can be non-conductive and environmentally protects the vertical interconnects 56 from external elements and contaminants. The molded bridges 100 can optionally undergo a curing process to cure first encapsulant 60 as part of the method. In some embodiments, a first planarized surface 60a of first encapsulant 60 can be substantially coplanar with planarized ends 56a of vertical interconnects 56. As used herein, "about" or "substantially" means a percent difference less than or equal to 30% difference, 20% difference, 10% difference, or 5% difference depending upon the needs of a particular process or structure. Another option for forming the posts is to mold first, laser drill the holes and then plate up the Cu posts in the holes, or alternatively over-plating the surface a bit so that when the surface is ground back, the posts are planar with the mold compound, and any excess over-plated metal is removed. The resulting structure will still look like the structure illustrated in FIG. 2B using this alternate method.

While two molded bridges 100 are depicted, a person of ordinary skill would understand that additional molded bridges 100 may be encapsulated in a single step.

Figures 2C, 2D:
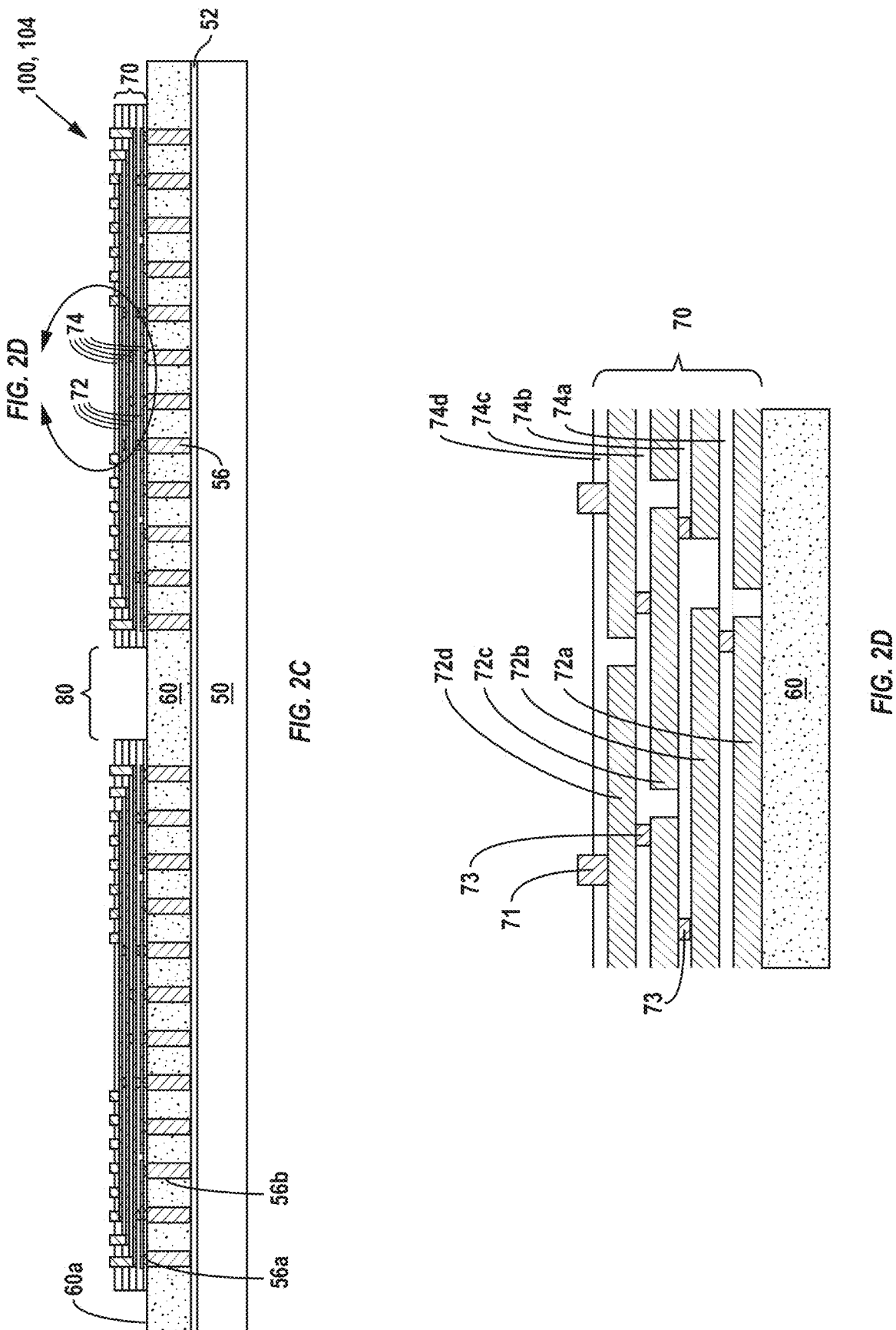
FIG. 2D illustrates a detail view from FIG. 2C showing an embodiment of a build-up interconnect structure with dielectric layers formed from a polymer which is not encapsulant.

FIG. 2C, continuing from FIG. 2B, depicts a molded bridge 100 comprising a first encapsulant 60 and a first build-up interconnect structure 70 disposed over and coupled to the first encapsulant. Further illustrated is forming the first build-up interconnect structure 70 over the first encapsulant 60 and over vertical interconnects 56. In some embodiments, the first encapsulant 60 may be ground and/or planarized, and may comprise a first planarized surface 60a over which the first build-up interconnect structure 70 may be formed. The first build-up interconnect structure 70 may comprise a plurality of alternating or interleaved conductive layers 72, and dielectric layers 74, such as polyimide (PI). The conductive layers 72 can be one or more layers of Al, Cu, Sn, Ni, Au, Ag, or other suitable electrically conductive material, and may be electrically connected to vertical interconnects 56 and to one another as necessary in the design of the molded bridge 100. Other portions of conductive layers 72 can be electrically common or electrically isolated depending on the design and function of the molded bridge 100. In some embodiments there may be vias between two or more conductive layers 72. In the embodiments of FIGS. 2A-2C, the molded bridge 100 comprises a molded bridge 104 without a chip, and comprising an embedded build-up interconnect structure 70 which may provide routing and vertical interconnection in place of a component, chip or silicon-based bridge die. In additional embodiments, the molded bridge 100 may comprise one or more components or chips as shown and described herein to form molded bridges 102.

As shown in the detail view of FIG. 2D, the insulating or dielectric layers 74 may be interleaved and formed between conductive layers 72 for electrical isolation. The insulating or dielectric layers 74 may comprise one or more layers of $SiO_2$, $Si_3N_4$, SiON, $Ta_2O5$, $Al_2O_3$, polyimide (PI), benzocyclobutene (BCB), polybenzoxazoles (PBO), Ajinomoto Buildup Film (ABF), or other material having similar insulating and structural properties. In an embodiment, the insulating layer 74 is a photoresist layer. In particular embodiments, the dielectric layers 74 may be formed comprising polyimide (PI). The dielectric layer 74 may be formed using PVD, CVD, printing, spin coating, spray coating, sintering, thermal oxidation, sol-gel, or other suitable processes. The dielectric layer 74 may be patterned and a portion of the dielectric layer 74 may be removed by etching, laser drilling, mechanical drilling, or other suitable process to form openings completely through the dielectric layer and to expose at least a portion of the conductive layers 72 for subsequent mechanical and electrical interconnection. In many cases, the dielectric will be photo-sensitive or photo-imageable so that the process to form the via holes will be by patterning and developing. The detail view of FIG. 2D illustrates an embodiment of first build-up interconnect structure 70, which in some instances may be similar to lower base build-up interconnect structure 115 and second build-up interconnect structure 130, as further discussed herein. FIG. 2D depicts a detail view of build-up interconnect structure 70 disposed over first encapsulant 60 as part of a molded bridge 104. While shown as part of molded bridge 104 without a chip 24, build-up interconnect structure 70 is shown and described as part of molded bridge 100 and 102, comprising a chip or component 24. In this instance, build-up interconnect structure 70 comprises dielectric layers 74a, 74b, 74c and 74d, and conductive layer 72, formed as conductive layers 72a, 72b, 72c and 72d, where conductive routing layers 72 may have direct contacts 73, interleaved between the dielectric layers 74. In some instances, one or more of the first build-up interconnect structure 70, lower base build-up interconnect structure 115, and the second build-up interconnect structure 130 may comprise one or more power and (or) ground planes, as well as signal routing, having one or more thicknesses for ground and power planes, as well as one or more thicknesses for signal routing. In some instances, one or more of the first build-up interconnect structure 70, lower base build-up interconnect structure 115, and the second build-up interconnect structure 130 may comprise multiple power planes having different voltages.

Figures 3A, 3B:
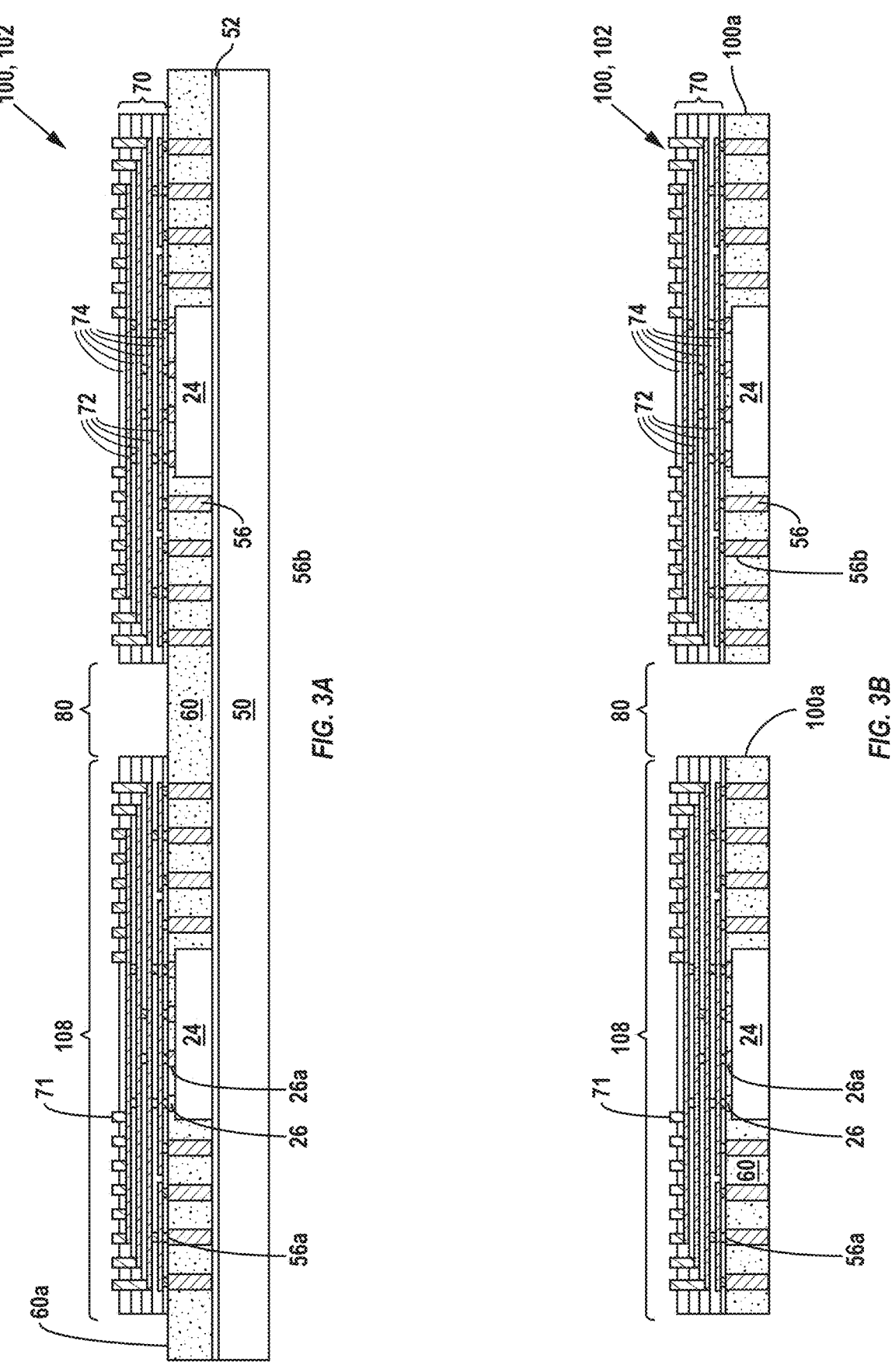
FIGS. 3A-3D illustrate formation of embodiments of molded bridges having polymer based dielectric layers as part of a build-up interconnect structure, further comprising an embedded chip or component.

FIG. 3A is similar to FIG. 2C, but illustrates an alternative embodiment to that of FIG. 2C, in which a molded bridge 102 comprises an embedded chip, a device or component 24 disposed within the first encapsulant 60, with the vertical interconnects 56 disposed around, in a periphery 122 or perimeter about, the chip 24. The embedded chip or component 24 may comprise one or more of a semiconductor chip, a chiplet, an active device, an integrated circuit (IC), a passive device, and integrated passive device (IPD), a deep trench capacitor (DTC), a transformer, a voltage regulator, power management IC (PMIC), a filter, a switch, an amplifier, an interface, a repeater or retimer, a clock, a processor, a controller, an accelerator, a memory, a non-volatile memory (NVM), a bridge (e.g., Si bridge), a MEMS device, an optical device, an opto-electronic device, a cache and a buffer. FIG. 3A also illustrates conductive bumps, conductive interconnects, or electrical interconnect structures 26 that can be formed as columns, pillars, posts, thick RDLs, bumps, or studs that are formed of copper or other suitable conductive material, which are disposed over, and electrically coupled or connected to, chips 24. Electrical interconnect structures 26 may comprise sides, side surfaces or sidewalls 26a. Sides 26a of the electrical interconnect structures 26 and sides 56b of vertical interconnects 56 directly contact the first encapsulant 60. Further details are disclosed in U.S. Pat. No. 11,538,759, entitled "Fully Molded Bridge Interposer and Method of Making The Same" which issued on Dec. 27, 2022, the disclosure of which is incorporated herein in its entirety. The chips 24 are disposed with conductive bumps, interconnects or structures face up over the first temporary carrier 50 before the placement of the first encapsulant 60, the chips 24 being disposed over the first temporary carrier 50, either before or after the formation of the vertical interconnects 56. FIG. 3A further shows the insulating layers 74 as shown and described for FIG. 2C, further illustrating a molded bridge footprint 108 of the molded bridge 100, 102, which in some instances corresponds to a footprint of the first build up interconnect structure 70. Ends, exposed ends or planarized ends 71 are seen formed over first build up interconnect structure 70 and provide interconnection between subsequently formed build up interconnect structures.

FIG. 3B, continuing from FIG. 3A, illustrates removing the first temporary carrier 50 from the molded bridges 100 and singulating the molded bridges from each other by removing material in the saw street 80, forming edges 100a of the molded bridge or molded RDL bridge 100, 102 and in a molded bridge or molded RDL bridge without a component, 104. FIG. 3B also illustrates the molded bridges 100 can be singulated through gaps or saw streets 80 using laser grooving, a saw blade or laser cutting tool, or both to singulate the molded bridges 100 into individual molded bridges 100. The molded bridges 100 can then be used as part of a subsequently formed electronic assembly 200 as discussed in greater detail below with respect to FIGS. 7E-8.

A person of ordinary skill in the art (POSA) will appreciate that a similar process may occur for the structure illustrated in FIG. 2C.

Figure 3C:
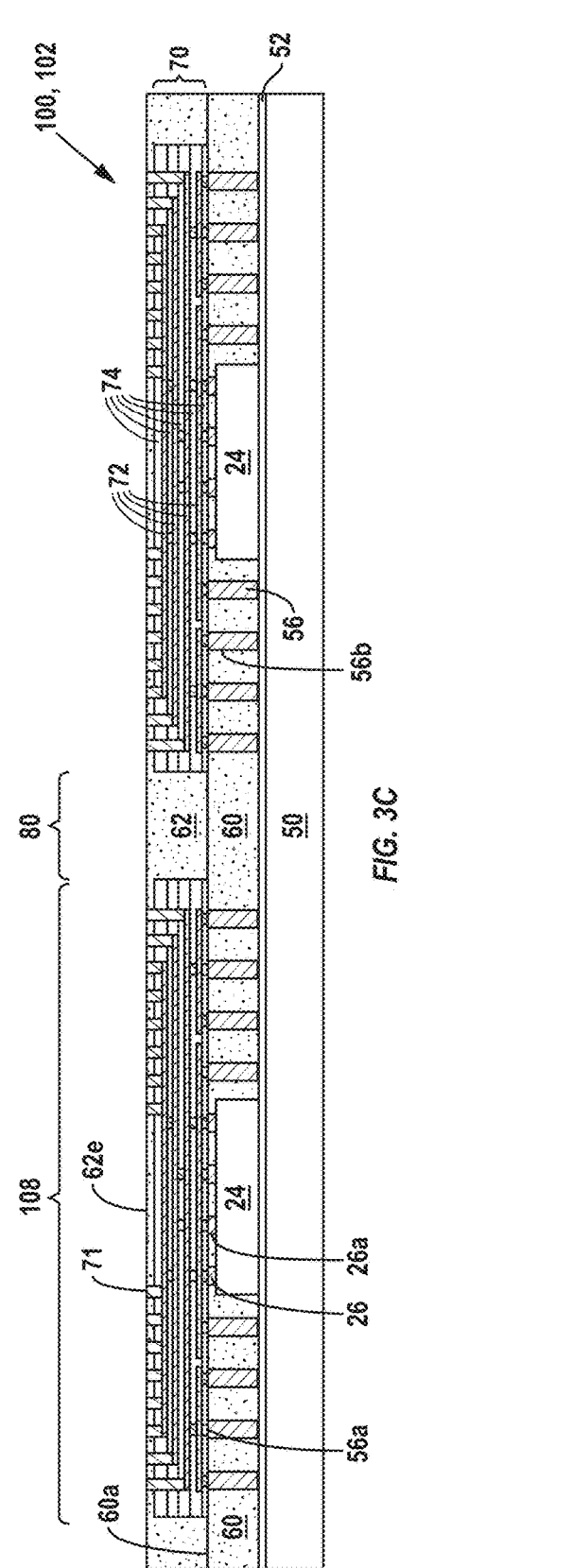
Figure 3D:
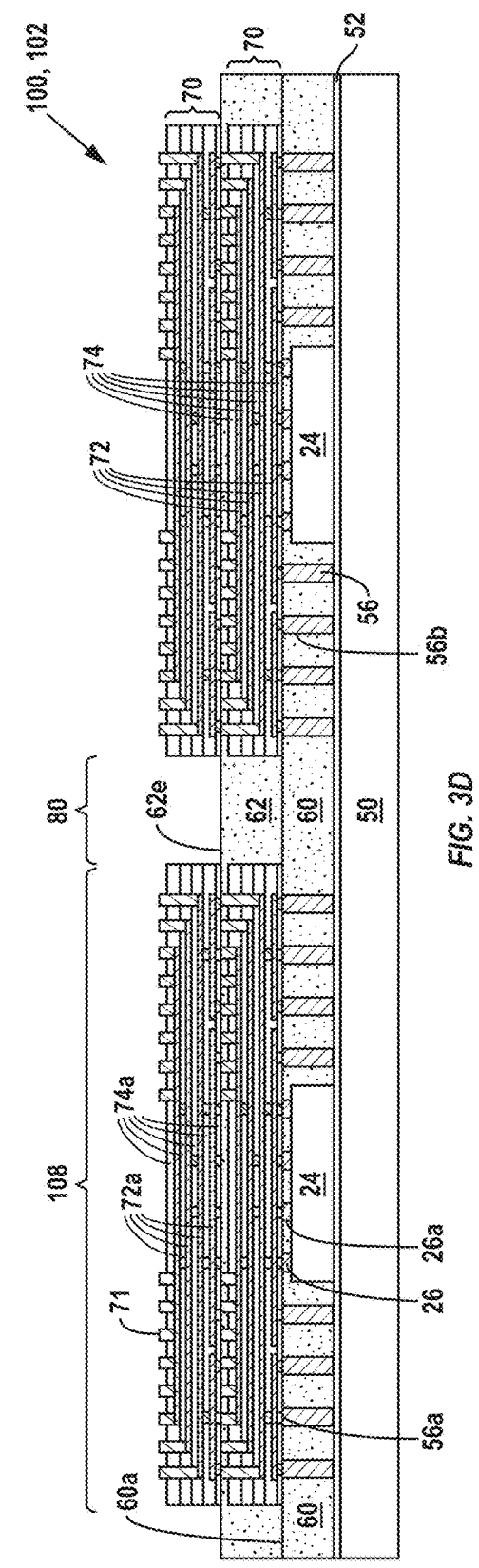
Figures 3E, 3F:
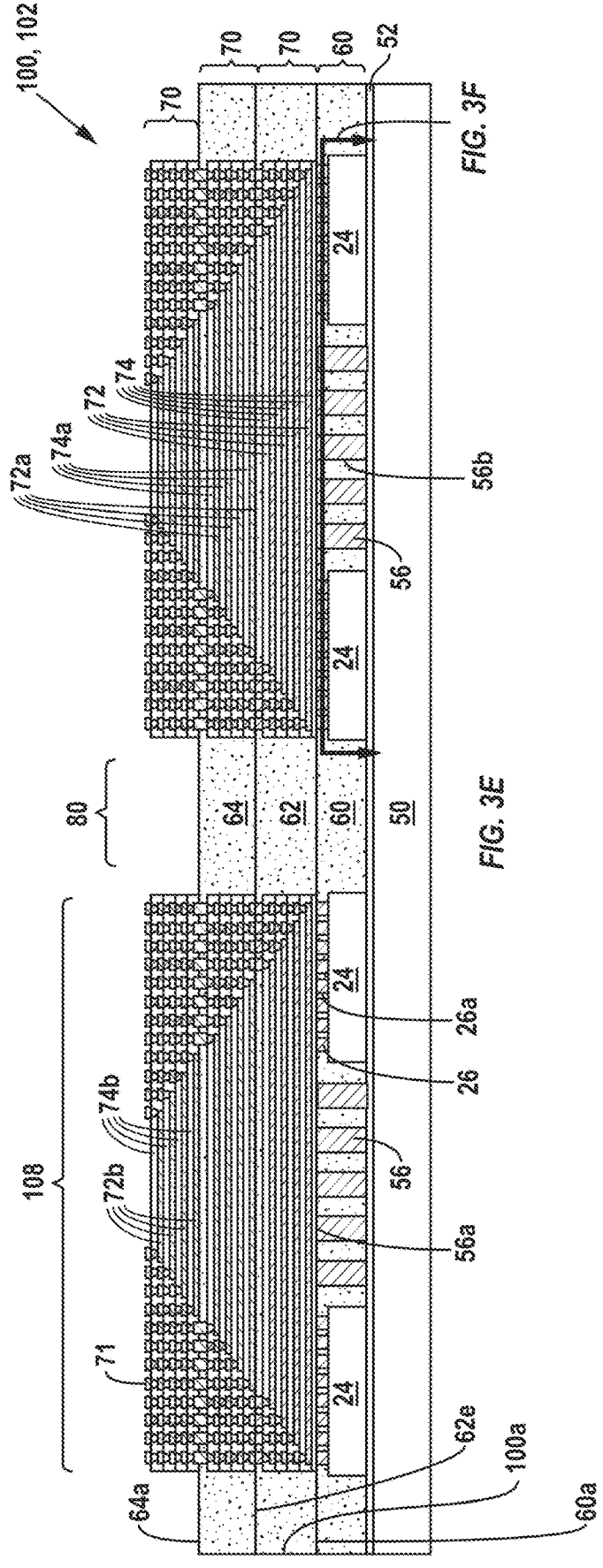
FIG. 3E continues from FIG. 3D and illustrates embodiments of molded bridges comprising one or more peripherally located embedded chips or components and multiple layers of a build-up interconnect structure with multiple layers of encapsulant.
FIG. 3F shows a plan view of one embodiment of the molded bridges as disclosed herein.
Figure 3F:
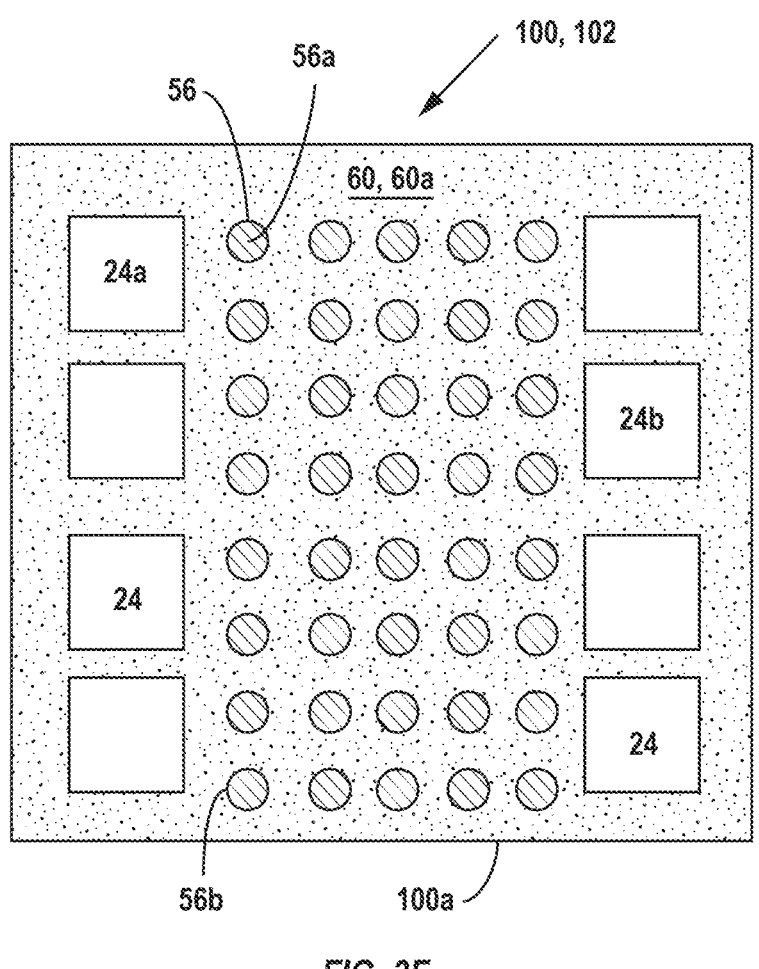

FIG. 3C, continuing from FIG. 3A further illustrates disposing an additional encapsulant 62 over the first build up structure 70 comprising a first set of a plurality of dielectric layers 74 interleaved with a plurality of conductive routing layers 72 and disposed over the first encapsulant 60. Where more than two additional encapsulant layers are contemplated, additional encapsulants may be designated as 62, 64, etc. (as depicted in FIG. 3E), 66 and similar, without limitation. The first build-up interconnect structure 70 as part of the molded bridges or molded RDL bridges 100, 102, 104, may comprise one or more additional encapsulants sandwiched between one or more dielectric layers interleaved with one or more conductive layers, such as routing layers, where a first set of the one or more dielectric layers may be interleaved with the one or more conductive layers and disposed over the first encapsulant, and additional encapsulants may be disposed over the first set of the one or more dielectric layers interleaved with the one or more conductive routing layers. Further, a second set of the one or more dielectric layers may be interleaved with the one or more conductive routing layers and disposed over the additional encapsulants. One or more additional encapsulant layers 62, 64 and similar may comprise the same or similar materials as first encapsulant 60 and second encapsulant 124. Additional encapsulant layers 62, 64, etc. may be a material suitable for planarizing such as through chemical mechanical planarizing (CMP), diamond cutter planarizing, or grinding as described herein for first encapsulant 60 and second encapsulant 124. Accordingly, FIG. 3C illustrates where additional encapsulant layer 62 has been planarized and comprises second planarized surface 62e, in addition to first planarized surface 60a for first encapsulant 60, with first build-up interconnect structure 70 disposed therebetween such that first build-up interconnect structure 70 is "sandwiched" between first encapsulant 60 and additional encapsulant 62. Accordingly, ends or exposed ends 71 as part of build-up interconnect structure 70 are also planarized such that they are substantially coplanar with planarized surface 62e and provide interconnection between subsequently formed build up interconnect structures, as seen in FIG. 3D. FIG. 3D, continuing from FIG. 3C further illustrates forming an additional build-up interconnect structure 70, comprising a second set of additional, second conductive layers 72a (in some instances comprising routing layers) and additional, second dielectric layers 74a, disposed over the additional encapsulant 62, and disposed over the first build-up structure 70. The second conductive layers 72a and second dielectric layers 74a may be interleaved and disposed over additional encapsulant 62 as described for FIG. 2C. In some instances, any of conductive layers 72, 72a, etc. may be used for power, ground, or signal routing.

FIG. 3E illustrates another instance, which includes the aspect from FIG. 3D of a first build up interconnect structure 70 covered or overmolded by an additional encapsulant 62, followed by a second build up interconnect structure 70 covered or overmolded by yet another additional encapsulant 64. The second build up interconnect structure 70 may comprise a third set of additional, third routing layers 72b and additional, third dielectric layers 74b, disposed over the additional encapsulant 64. Additional encapsulant 64, similar to encapsulants 62, 124 and 60, may be planarized or ground to form planarized surface 64a, and second build up interconnect structure 70 formed thereon. A POSA will appreciate that this pattern of disposing a first encapsulant, disposing a build-up interconnect 70 comprising dielectric layers of polyimide or encapsulant over the first encapsulant, disposing an additional encapsulant, disposing an additional build-up interconnect 70 comprising dielectric layers of polyimide or encapsulant over the additional encapsulant, thereby forming a layered, "sandwich" type structure of alternating encapsulant layers and build-up interconnect layers 70, can be repeated as many times as desired and that additional encapsulants, routing layers and dielectric layers beyond those as shown are possible. Additional grinding or planarization processes are also possible, although not depicted. FIG. 3E differs from FIG. 3D in the arrangement of the chip 24 and the vertical interconnects 56. FIG. 3D illustrates a molded bridge or molded RDL bridge 100, 102, 104 comprising a centrally located chip 24 with vertical interconnects 56 disposed around a periphery of the chip 24 such that the vertical interconnects 56 are disposed at, along, or adjacent an edge 100a of the molded bridge 100 or molded bridge 102 with the chip 24. FIG. 3E illustrates centrally located vertical interconnects 56 with chips 24 disposed around a periphery 122 of the vertical interconnects 56 such that the chips 24 are disposed at, along, or adjacent an edge 100a of the molded bridge 100 or molded bridge 102 with the chip 24. A POSA would understand that for all embodiments shown and described herein, one or more chips 24 may be centrally located with vertical interconnects 56 disposed around a periphery 122 of the chip 24, and one or more vertical interconnects 56 may be centrally located with chips 24 disposed around a periphery of the vertical interconnects 56. According to some embodiments, periphery 122 may comprise combinations of vertical interconnects 56 and one or more chips 24. In some instances, the molded bridge 100, 102 of FIG. 3E comprises two or more components or chips 24. According to embodiments of FIG. 3E, components or chips 24 may be disposed fully or partially around periphery 122 of FIGS. 6A and 6B. In some embodiments, the molded bridges 100, 102, 104 as shown and described herein may be formed with through silicon vias (TSVs) disposed therein. In additional embodiments, the molded bridges 100, 102, 104 provide a low impedance, high density vertical conductive interconnect without the need for TSVs and without the need for cost intensive, complex processing steps associated with the use of TSV technology. Accordingly, in some instances, the molded bridges 100, 102, 104 and assemblies 200, 202, 204 formed therefrom, provide a low impedance vertical interconnect and any of the molded bridges 100, 102, 104 may be formed without, and may not comprise through silicon vias (TSVs).

FIG. 3F depicts the section line depicted in FIG. 3E, illustrating a plan view of the molded bridge 100, 102 showing one or more components 24, 24a, 24b disposed around vertical interconnects 56 and disposed within first encapsulant 60. Further shown is an edge 100a of the molded bridge 100, 102.

Figures 4A, 4B:
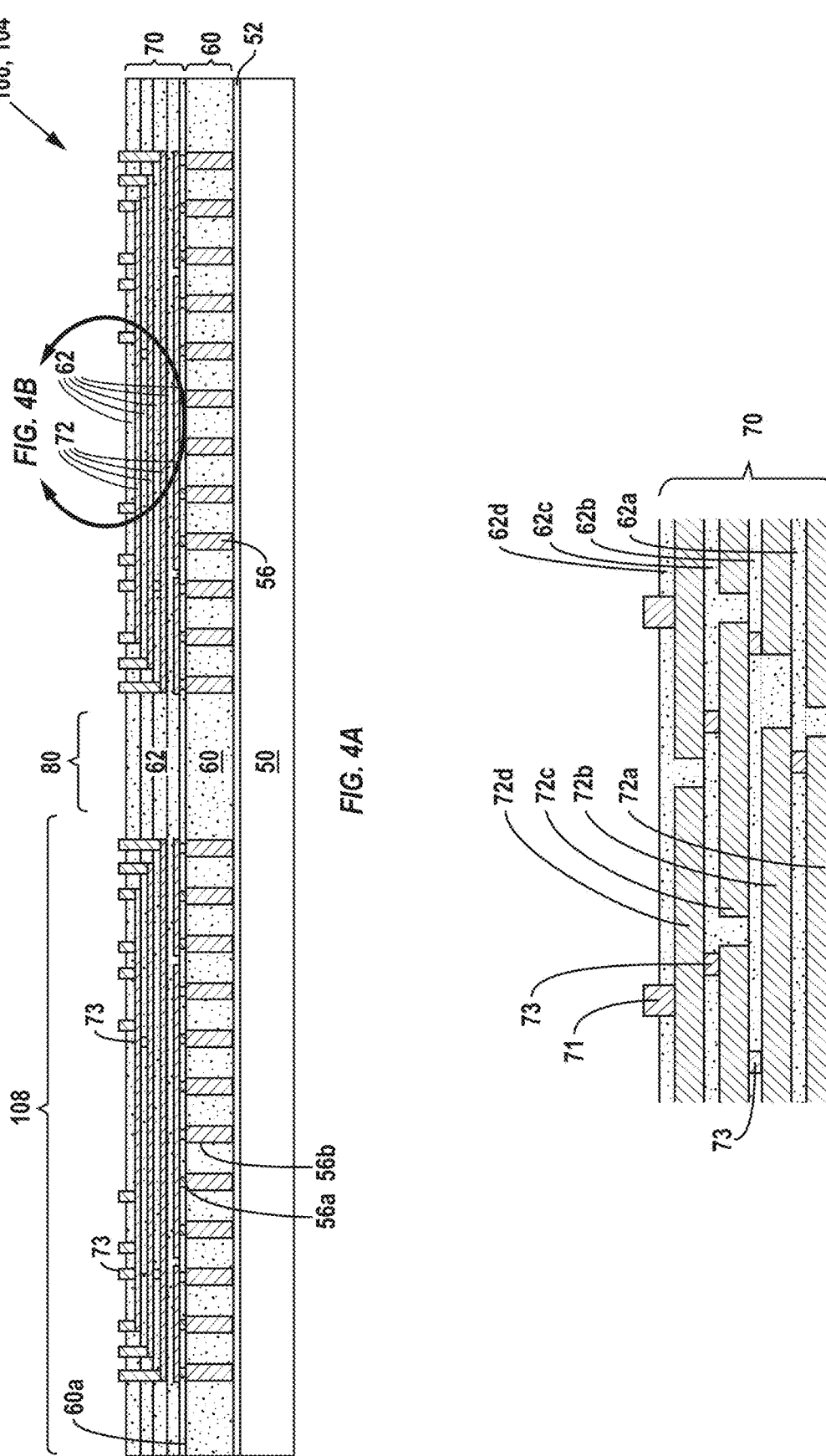
FIG. 4A illustrates forming a first build-up interconnect structure comprising dielectric layers formed of encapsulant as part of a molded bridge without a chip.
FIG. 4B illustrates a detail view from FIG. 4A showing an embodiment of a build-up interconnect structure comprising dielectric layers formed of encapsulant.

FIG. 4A, similar to FIG. 2C, illustrates forming the first build-up interconnect structure 70 as part of a molded bridge 104 without a chip 24. The first build-up interconnect structure 70 comprises a plurality of molded encapsulant layers 62 and a plurality of conductive routing layers 72 having direct contacts 73, interleaved with the plurality of molded encapsulant layers 62. Direct contacts 73 are formed in molded encapsulant layers 62 and provide electrical connection between conductive routing layers 72. Direct contacts 73 may be formed using similar methods and materials as for conductive routing layers 72. Thus, FIG. 4A differs from FIG. 2C by omitting conventional dielectric layers 74 like PI from the build-up interconnect structure 70, while instead using molded encapsulant layers 62. In the embodiment of FIG. 4A, the first build-up interconnect structure 70 is formed comprising a molded direct contact interconnect structure as is known under the trademark or tradename MDx™. Molded direct contact interconnect structures (and a method for making and using the same) are discussed in U.S. patent application Ser. No. 18/195,090, and issued on Apr. 30, 2024 as U.S. Pat. No. 11,973,051, the entirety of which is hereby incorporated herein by reference. The molded encapsulant layers 62, as well as first encapsulant 60 and any additional encapsulants, may be formed from a high resistivity material with a low loss tangent and matched coefficient of thermal expansion (CTE), such as a polymer (resin) matrix composite with fillers to adjust its mechanical, thermal, and electrical properties. Although not shown as layers, the first additional encapsulant 62 of FIG. 4A and subsequent FIGS. may comprise molded encapsulant layers 62, as shown by FIG. 4B.

FIG. 4B illustrates a detail view of build-up interconnect structure 70 disposed over first encapsulant 60 as part of a molded bridge 104 without a chip 24. In this instance, build-up interconnect structure 70 comprises molded encapsulant layers 62a, 62b, 62c and 62d, formed from additional encapsulant 62, and comprising conductive layers 72, and direct contacts 73, for interconnection between the conductive layers 72, interleaved between the encapsulant layers 62. Each molded encapsulant layer 62a-62d may be ground or planarized prior to disposing additional conductive layers 72 and subsequent encapsulant layers. The first build-up interconnect structure 70 may comprise conductive routing layers formed as conductive traces with encapsulant 62 contacting 4 sides of the conductive traces 70.

Figures 5A, 5B:
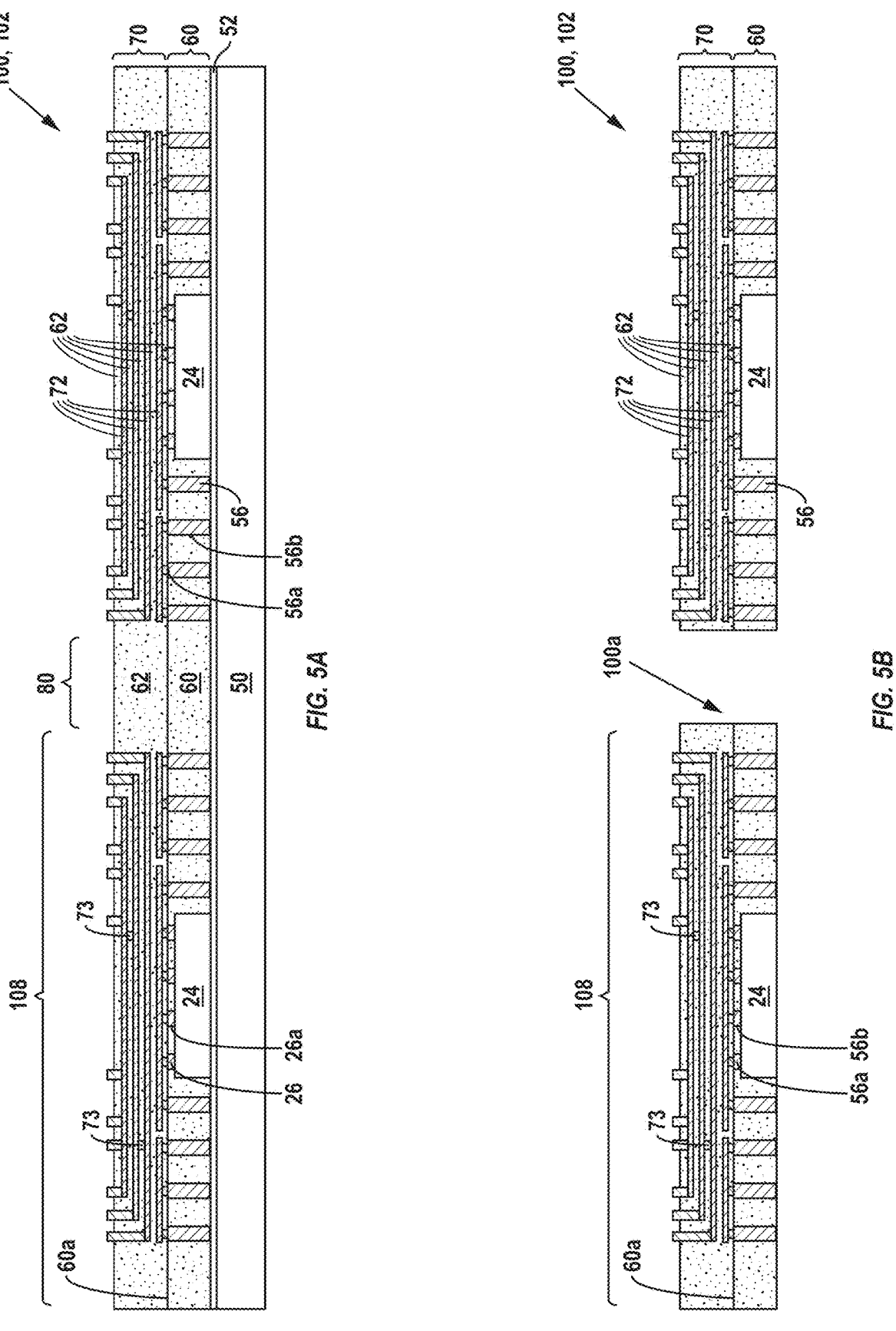
FIGS. 5A-5B illustrate formation of embodiments of molded bridges similar to FIGS. 4A and 4B, further comprising an embedded chip or component.

FIG. 5A, similar to FIG. 3A, illustrates forming the first build-up interconnect structure 70 as part of a molded bridge 102 comprising a chip 24. Similar to FIG. 4A, the first build-up interconnect structure 70 comprises a plurality of molded encapsulant layers 62 and a plurality of conductive routing layers 72 with direct contacts 73, interleaved with the plurality of molded encapsulant layers 62. Individual dielectric layers as shown for FIGS. 4A and 4B are not depicted in FIG. 5B and subsequent, for simplicity and convenience, but a POSA would understand that they would be present as shown in earlier FIGS. Thus, FIG. 5A differs from FIG. 3A by omitting conventional dielectric layers 74 like PI from the build-up interconnect structure 70, while instead using molded encapsulant layers 62. Stated another way, FIG. 5A differs from FIG. 4A, which comprises a molded bridge 104 without a chip 24, by comprising a molded bridge 102 comprising a chip 24.

FIG. 5B, continuing from FIG. 5A, illustrates removing the first temporary carrier 50 from the molded bridges 102 and singulating the molded bridges 102 from each other by removing material in the saw street 80. A person of ordinary skill in the art (POSA) will appreciate that a similar singulation process may occur as described and illustrated for FIG. 3B above.

Figure 6A:
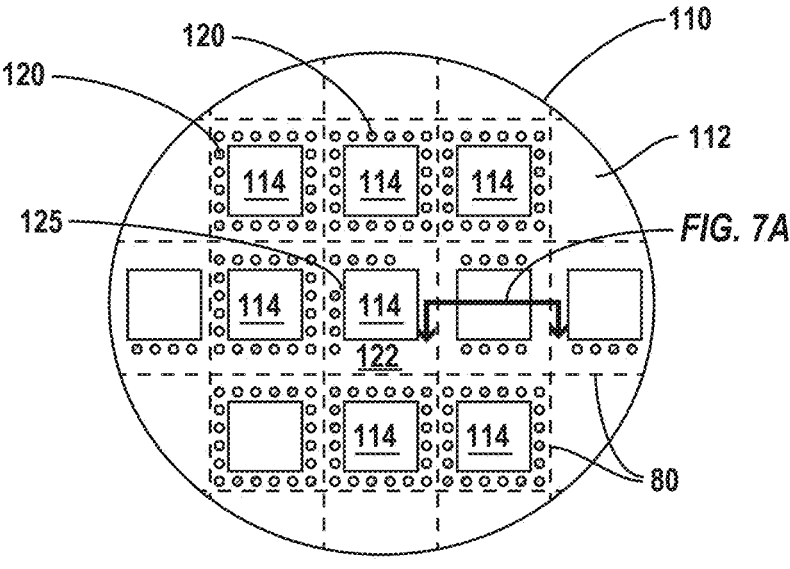
FIGS. 6A and 6B illustrate a top or plan view of a plurality of molded bridge mounting sites or molded RDL bridge mounting sites.
Figure 7A:
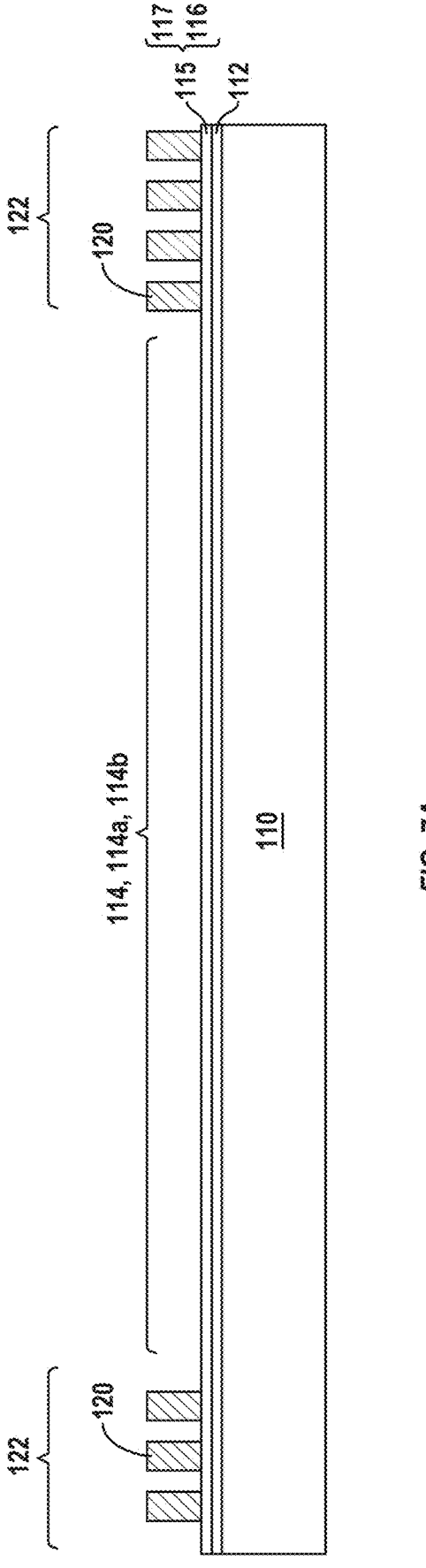
FIGS. 7A-7F illustrate cross-sectional side views of an assembly process for formation of the electronic assemblies according to embodiments as disclosed herein.
Figure 7B:
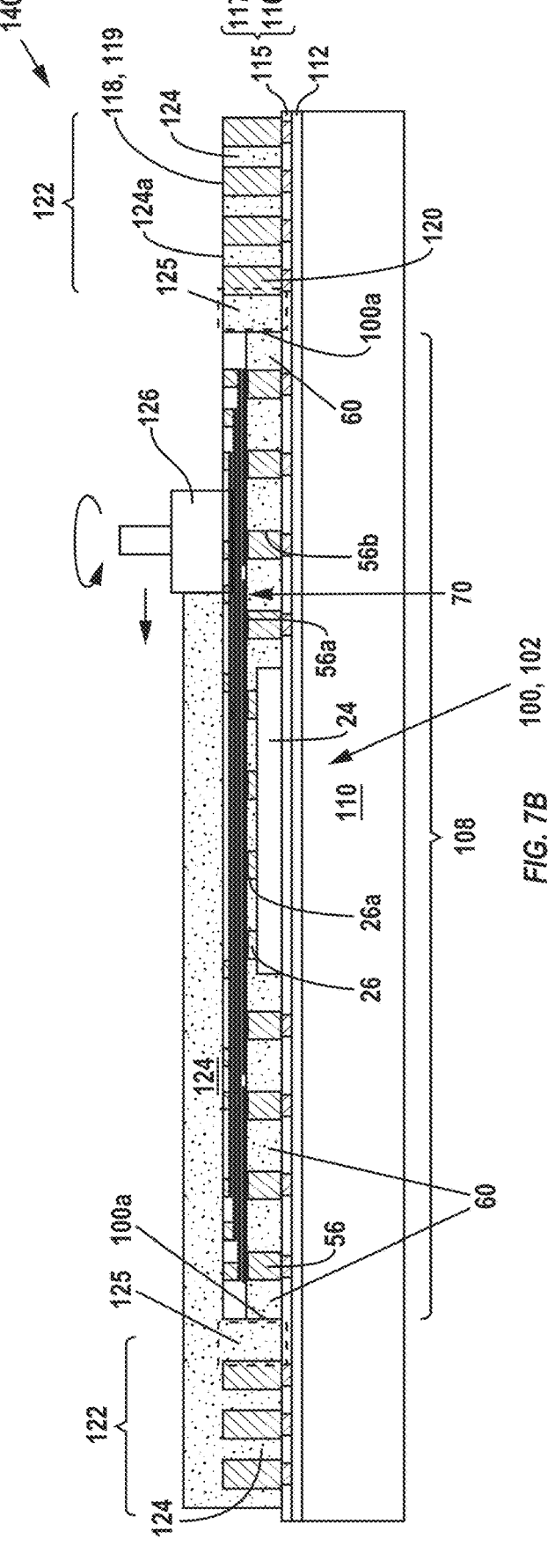
Figure 7C:
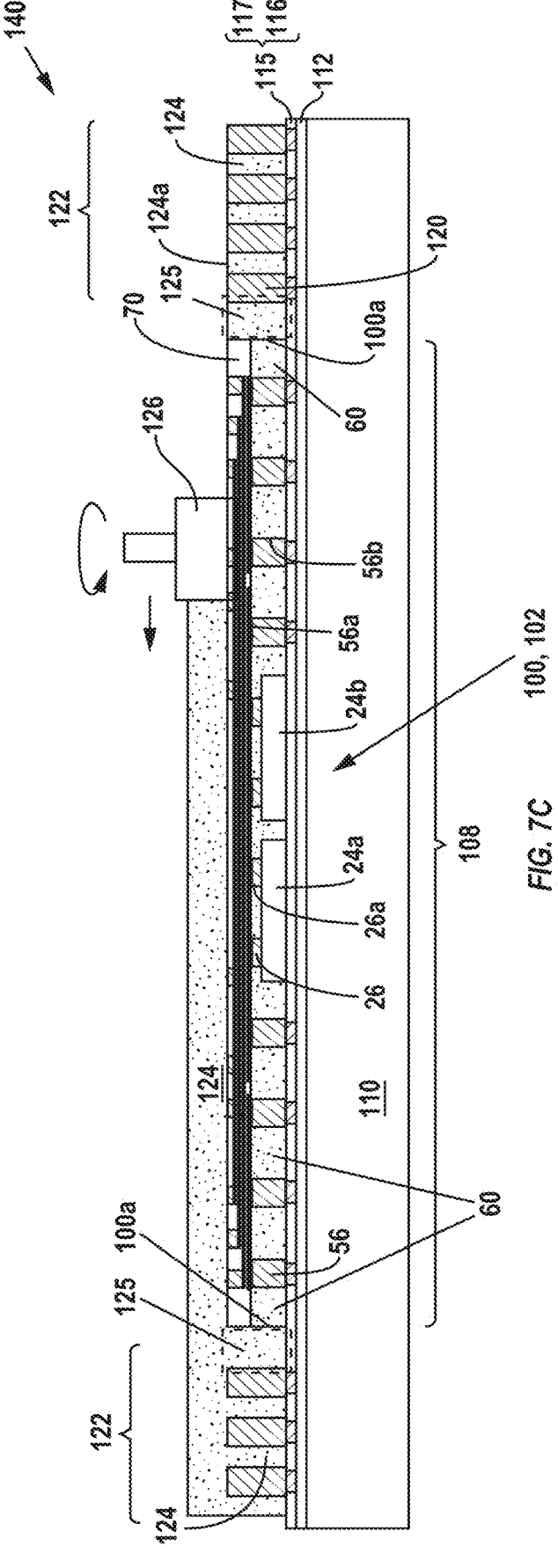
Figure 7D:
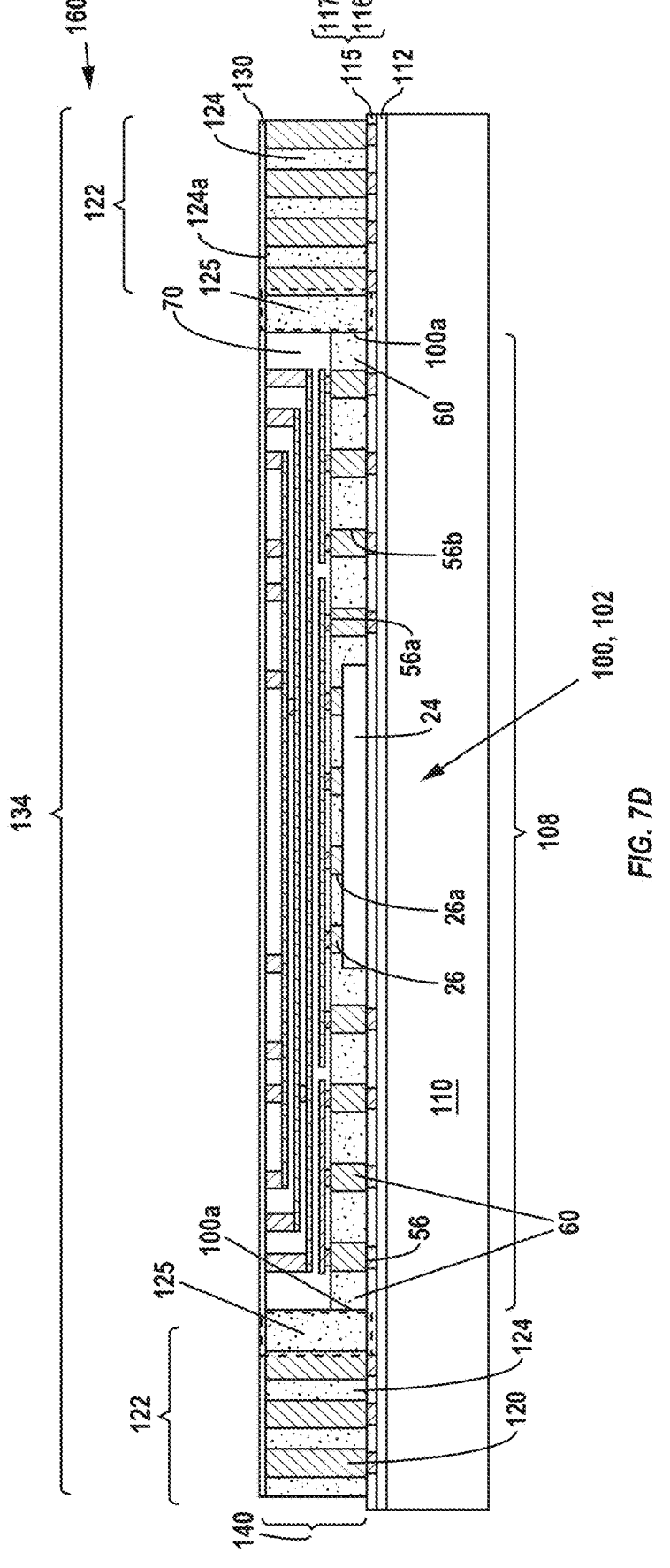

FIG. 6A illustrates a top or plan view of a plurality of molded bridge mounting sites or molded RDL bridge mounting sites 114, each having a periphery 122 around the mounting sites, being formed or disposed over a second temporary carrier 110 and separated by saw streets 80. Further illustrated are a plurality of through conductive interconnects 120 of the molded bridge mounting sites 114, and future location of encapsulant margin, margin, border or rim 125 surrounding the molded bridge mounting sites 114, as further described in FIGS. 7B-7E following. FIGS. 7A-8, included and discussed further below, illustrate cross-sectional side views of various embodiments of electronic assemblies 200, 202, and 204 being formed, as taken along detail line labeled FIG. 7A.

Figure 6B:
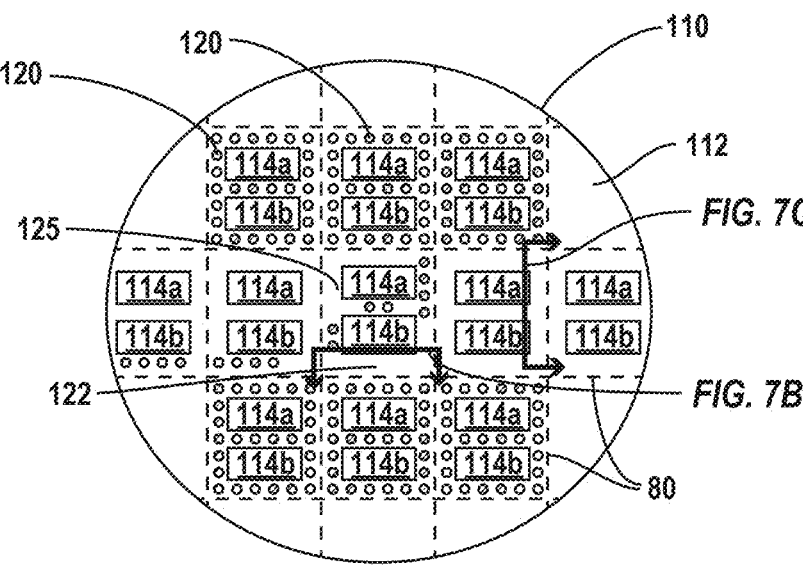

FIG. 6B, depicts a top or plan view of a plurality of molded bridge mounting sites 114a and 114b, for a first chip 24a and a second chip 24b, respectively. Further shown are a plurality of through conductive interconnects 120 disposed around the plurality of molded bridge mounting sites 114a and 114b. FIGS. 7B and 7C, included and discussed further below, illustrate cross-sectional side views of various embodiments of electronic assemblies 200 and 202 being formed, as taken along detail lines labeled FIGS. 7B and 7C.

FIG. 7A, illustrates a cross-sectional side view of an assembly process for electronic assembly 200, comprising a second temporary carrier 110. The second temporary carrier 110 may comprise base materials such as metal, silicon, polymer, polymer composite, ceramic, perforated ceramic, glass, glass epoxy, stainless steel, mold compound, mold compound with filler, or other suitable low-cost, rigid material or bulk semiconductor material for structural support.

FIG. 7A shows providing the second temporary carrier 110 comprising a molded bridge mounting site 114, 114a, 114b, to which the molded bridge 100 may be coupled. A release tape or adhesion layer 112 may be disposed over the temporary carrier. The release tape 112 may comprise thermal epoxy, epoxy resin, B-stage epoxy laminating film, ultraviolet (UV) B-stage film adhesive layer, UV B-stage film adhesive layer including acrylic polymer, thermo-setting adhesive film layer, a suitable wafer backside coating, backgrind tape, epoxy-acrylate adhesive, or a PI-based adhesive. The release tape or adhesion layer 112 may be a film or laminate and may also be applied by spin coating or other suitable process. Further shown in FIG. 7A is a lower base build-up interconnect structure 115. The lower base build-up interconnect structure 115 may comprise redistribution layers (RDLs) 116 over the second temporary carrier 110 and dielectric layers 117, as shown in the enlarged view of FIG. 7D and FIG. 2D. The redistribution layers (RDLs) 116 and dielectric layers 117 may be interleaved in a similar manner as depicted in FIGS. 2C and 2D for conductive layers 72 and dielectric layers 74.

FIG. 7A further depicts forming through conductive interconnects 120 offset from at least one edge 100a of the molded bridge 100, such as in the periphery 122 of the mounting sites 114, 114a, 114b. The periphery 122 of the mounting sites 114, 114a, 114b extends around a perimeter of the molded bridge 100, as further illustrated in FIGS. 6A and 6B. The through conductive interconnects 120 can be formed as columns, pillars, posts, bumps, or studs that are formed of copper or other suitable conductive material. Through conductive interconnects 120 can be formed using patterning and metal deposition processes such as printing, PVD, CVD, sputtering, electrolytic plating, electroless plating, metal evaporation, metal sputtering, or other suitable metal deposition process. When through conductive interconnects 120 are formed by plating, a seed layer can be used as part of the plating process. Through conductive interconnects 120 can be one or more layers of Al, Cu, Sn, Ni, Au, Ag, Pd, solder, or other suitable electrically conductive material and can include one or more layers. In some embodiments, the through conductive interconnects 120 may comprise copper posts. In particular embodiments, the copper posts may have a height in a range of 20-100 micrometers ($\mu$m) and a cross-sectional thickness in a range of 3-20 $\mu$m. Through conductive interconnects 120 may couple physically and electrically with one or more portions of the RDLs 116.

In other embodiments, through conductive interconnects 120 of the molded bridge 100 may comprise 3D blocks 121 disposed in a vertical orientation as further described with reference to FIGS. 7F and 7G, and which are discussed in U.S. Provisional patent application Ser. No. 18/545,927, entitled "Semiconductor Assembly Comprising a 3D Block and Method of Making the Same" which was filed on Dec. 19, 2023, the entirety of which is incorporated herein by reference.

Figure 8:
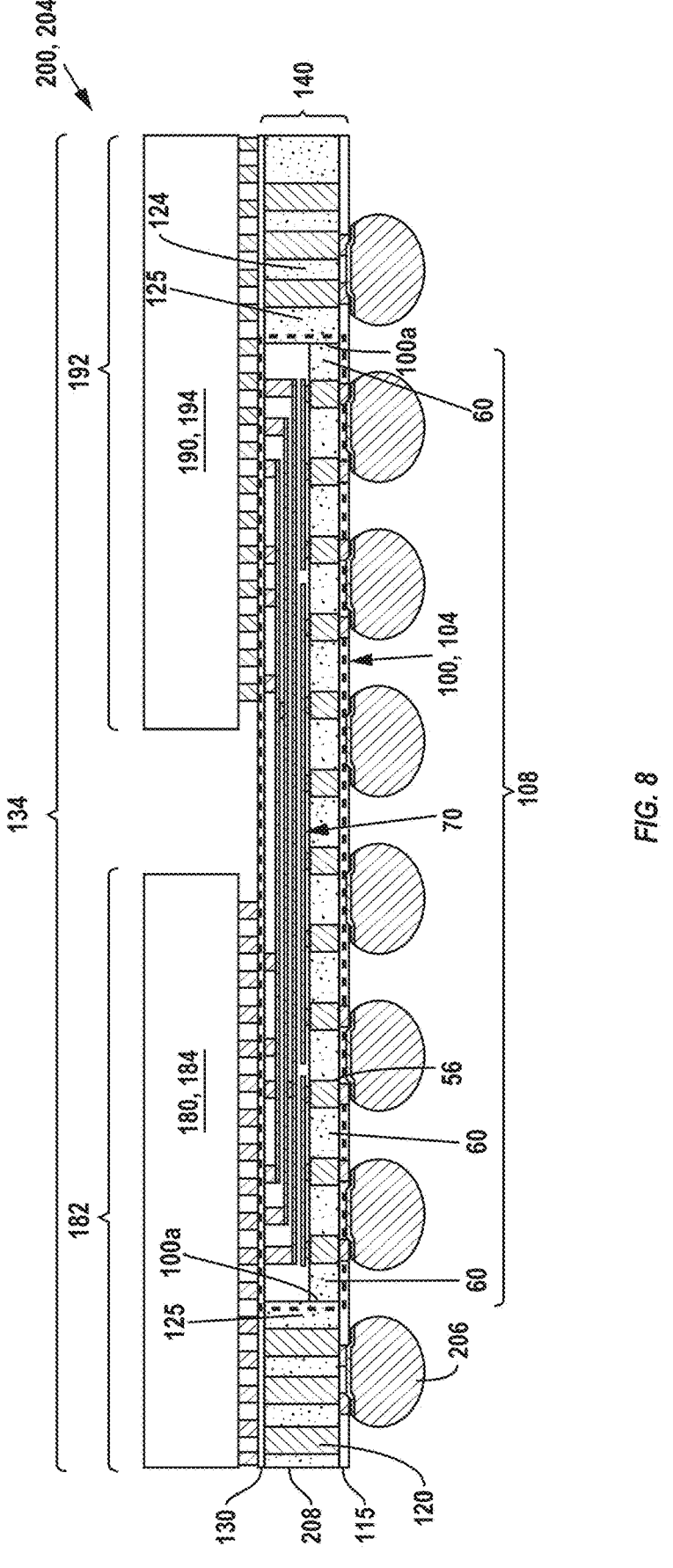
FIG. 8 illustrates an electronic assembly comprising a molded bridge formed without a chip comprising an embedded build-up interconnect structure.
Figure 9A:
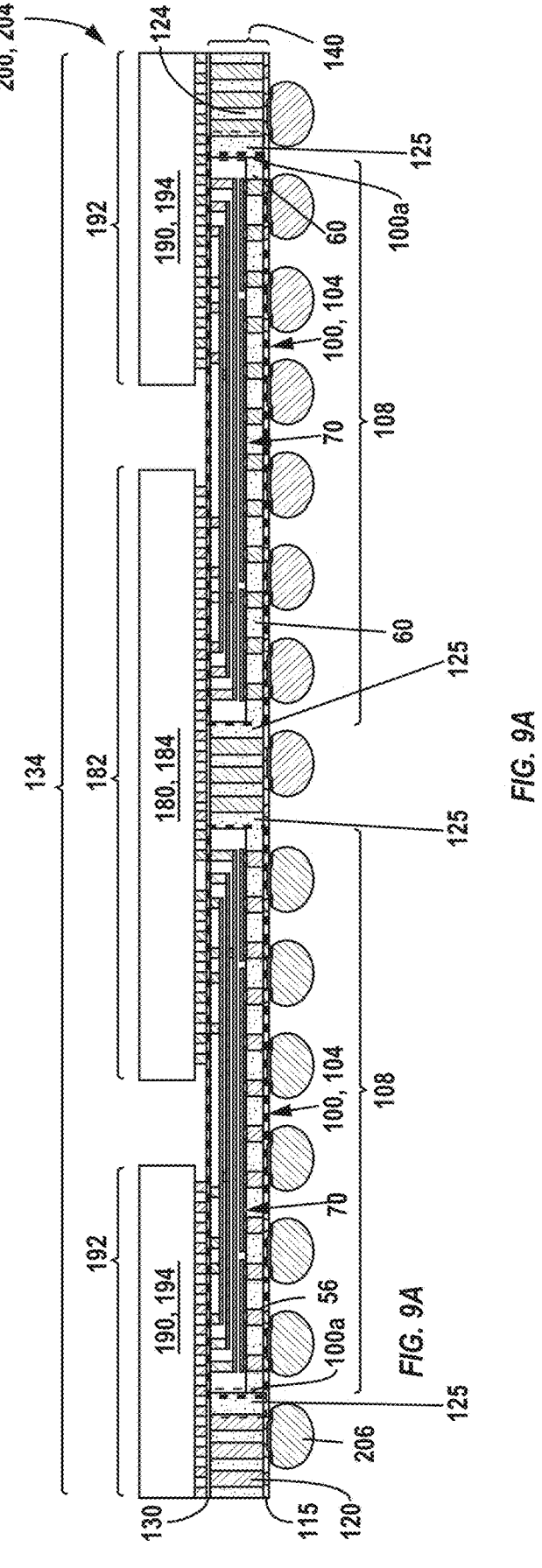
FIGS. 9A-9C illustrate instances of electronic assemblies 200 where embodiments of the molded bridges are formed with, and without, a chip or component, and comprise one or more devices disposed thereon.

FIG. 7B depicts formation of molded base 140 as part of the process of forming electronic assembly 202, where the embodiment of FIG. 7B shows a molded base 140 comprising a chip 24. Embodiments of molded base 140 without a chip 24 are shown in FIGS. 8, 9A and additional figures. The chip 24 may comprise electrical interconnect structures 26, as described for FIG. 3A previously, disposed over the chip 24. FIG. 7B further illustrates mounting the molded bridges 100 to the mounting sites 114 on the second temporary carrier 110, and disposing a second encapsulant 124 over the molded bridges 100 and around the through conductive interconnects 120 to form a molded base 140. The second encapsulant 124 can optionally undergo a curing process or post mold cure (PMC) to cure the second encapsulant 124 and form molded base 140. Through conductive interconnects 120 may be offset from at least one edge 100a of the molded bridges 100, 102, 104. The second encapsulant 124 may comprise an organic material, a mold compound, a polyimide, a composite material, such as epoxy resin with filler, such as ABF or epoxy acrylate with filler, and is a material suitable for planarizing, such as through chemical mechanical planarizing (CMP), diamond cutter planarizing, or grinding. Planarizing or grinding the second encapsulant 124 may be performed using grinding tool 126 to form a molded base 140 as shown in FIGS. 7C and 7D, having planarized second encapsulant surface, top surface, front surface, or first surface 124a. In some instances, the planarized second encapsulant surface 124a of the second encapsulant 124 can be substantially coplanar with first ends 119 of the through conductive interconnects 120. Alternatively, the planarized second encapsulant surface 124a of the encapsulant 124 can be over, offset, or vertically separated from the first ends 119 of the conductive interconnects 120, such that the first ends 119 of the conductive interconnects 120 are exposed with respect to the encapsulant 124 after the molded base 140 undergoes a grinding operation, or through a recess 118 in the encapsulant 124 to expose the first ends 119. In some embodiments, the first encapsulant 60 and the second encapsulant 124 may comprise the same type of encapsulant material. A perimeter of the first build-up interconnect structure 70, or an edge 100a of the molded bridge 100 may contact the second encapsulant 124, thereby forming encapsulant margin, border or rim 125 comprising the second encapsulant 124 laterally disposed around the perimeter, or edge 100a, of the first build-up interconnect structure 70 and molded bridge 100, and between the edge 100a of molded bridge 100 and the through conductive interconnects 120. A molded bridge footprint 108 of the molded bridge 100, 102, 104 including first build-up interconnect structure 70, is further illustrated within molded base 140, which later forms electronic assembly 202. In some embodiments, one or more vertical interconnects 56 may couple physically and electrically with one or more portions of the RDLs 116.

FIG. 7C, depicts molded base 140 as part of an electronic assembly 202 similar to that of 7B, comprising a first chip 24a and a second chip 24b having first encapsulant 60 contacting sides, side surfaces, or sidewalls 26a of electrical interconnect structures 26 disposed within molded bridge 102. As shown in FIG. 7C, a planarization or grinding may be performed and second encapsulant 124 further comprises a planarized surface 124a of second encapsulant 124, and planarized ends 120a (shown in FIG. 9D) of through conductive interconnects 120 which may be exposed by a grinding or planarization process as disclosed herein, for later electrical interconnection and RDL deposition.

FIG. 7D, continuing from FIG. 7B, illustrates forming a second build-up interconnect structure 130 comprising redistribution layers (RDLs) 132 over the molded base 140 including second encapsulant 124, to form molded interposer 160, comprising molded base 140 and second build-up interconnect structure 130. Molded interposer 160 may comprise build up interconnect structures 115 and 130 disposed on opposing sides. The molded interposers 150, 160 as disclosed herein may comprise other materials than that of conventional interposers which typically comprise silicon, and may include additional functionality. The molded interposers 150, 160 may comprise a printed circuit board (PCB), a substrate, a laminate, glass, ceramic and other similar materials. RDLs 132 are further illustrated in the enlarged view of FIG. 7G following. A footprint 134 of the second build-up interconnect structure 130 may be larger than, and includes all of, a molded bridge footprint 108 of the molded bridges 100, 102, 104, including first build-up interconnect structure 70. In some instances, the molded base 140 may comprise a molded bridge 102 comprising at least the first chip 24a and second chip 24b as shown in FIG. 7C, or additional chips according to design.

Figure 7E:
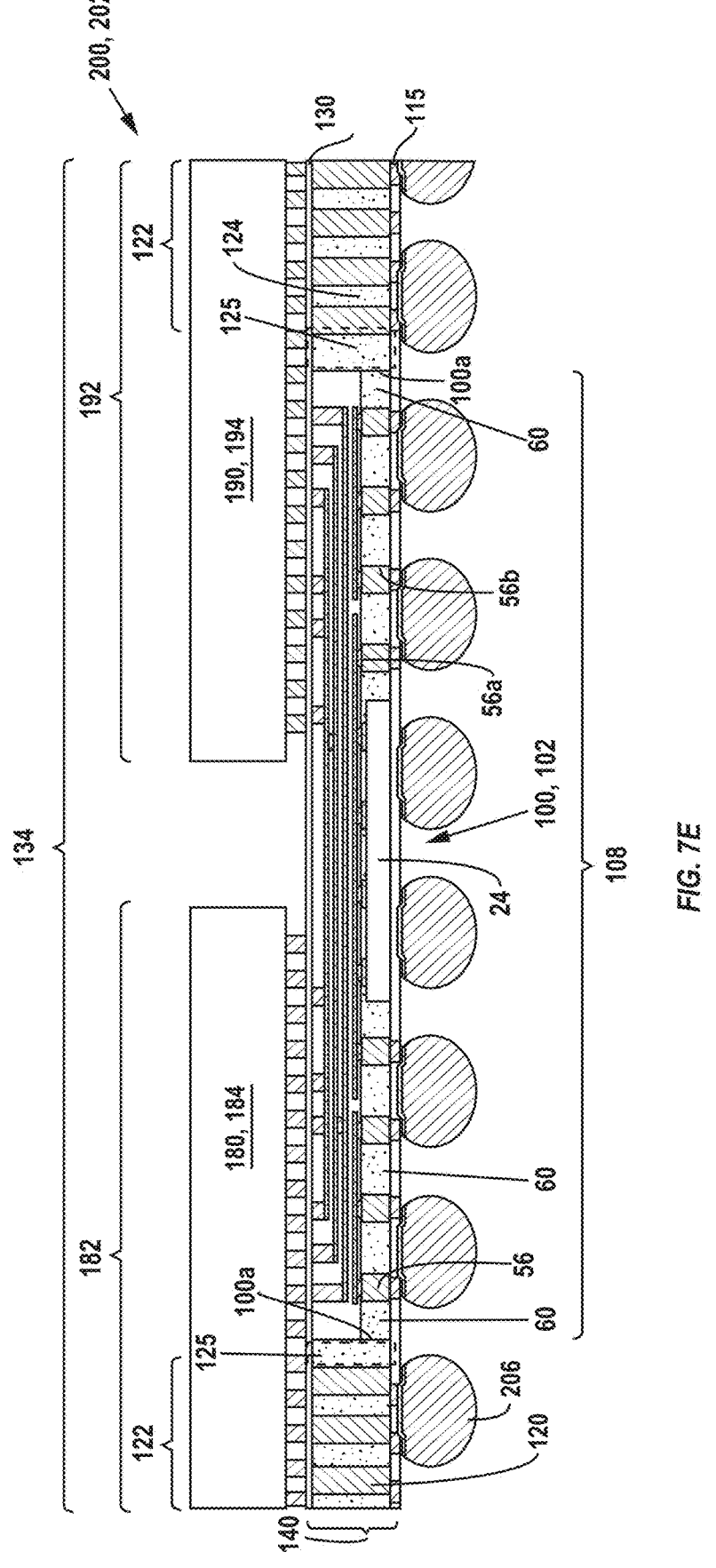

FIG. 7E illustrates an electronic assembly 200, 202 comprising at least one chip 24. FIG. 7E depicts disposing a first device 180 over the second build-up interconnect structure 130, including over molded base 140 comprising molded bridge 100, 102, 104. A footprint 182 of the first device 180 is partially over the molded bridge 100 and partially over the through conductive interconnects 120 disposed in periphery 122. In particular embodiments, the first device 180 may comprise one or more of a processor or a system on chip (SOC) device, a memory device, such as a high bandwidth memory (HBM) device, a sensor, a semiconductor chip, a chiplet, an active device, an integrated circuit (IC), a passive device, and integrated passive device (IPD), a deep trench capacitor (DTC), a transformer, a voltage regulator, power management IC (PMIC), a filter, a switch, an amplifier, an interface, a repeater or retimer, a clock, a processor, a controller, an accelerator, a memory, a non-volatile memory (NVM), a bridge (e.g., Si bridge), a MEMS device, an optical device, an opto-electronic device, a cache and a buffer, 184. FIG. 7E further depicts disposing a second device 190 over the second build-up interconnect structure 130, including over the molded base 140 comprising molded bridge 100, 102, 104. A footprint 192 of the second device 190 is partially over the molded bridge 100 and partially over the through conductive interconnects 120 disposed in periphery 122. In particular embodiments, the second device 190 may comprise one or more of a system on chip (SOC) device, a memory device, such as a high bandwidth memory (HBM) device, a sensor, a semiconductor chip, a chiplet, an active device, an integrated circuit (IC), a passive device, and integrated passive device (IPD), a deep trench capacitor (DTC), a transformer, a voltage regulator, power management IC (PMIC), a filter, a switch, an amplifier, an interface, a repeater or retimer, a clock, a processor, a controller, an accelerator, a memory, a non-volatile memory (NVM), a bridge (e.g., Si bridge), a MEMS device, an optical device, an opto-electronic device, a cache and a buffer, 194. In further embodiments, the first device 180 may comprise a processor or a system on chip (SOC) device 184 in combination with a second device 190 comprising a memory device, such as a high bandwidth memory (HBM) device 194. A footprint 134 of the second build-up interconnect structure 130 is larger than, and includes all of, a footprint 182 of the first device 180, and a footprint 192 of the second device 190.

The electronic assemblies 200, 202, 204 may comprise unit specific patterning such that a first misalignment between an edge 100a of the molded bridge 100 and an edge 208 of the electronic assembly 200, 202, 204 is greater than a second misalignment between an edge 100a of either the molded bridge 100 and the first build-up interconnect structure 70, or the first build-up interconnect structure 70 or an edge 100a of the molded bridge 100, and the second build-up interconnect structure 130.

Further illustrated in FIG. 7E are package level interconnects 206 which may comprise lands, balls, pins, and external interconnects. Package level interconnects 206 may comprise solder bumps, plated copper plus solder, solder balls, and the like.

Figure 7F:
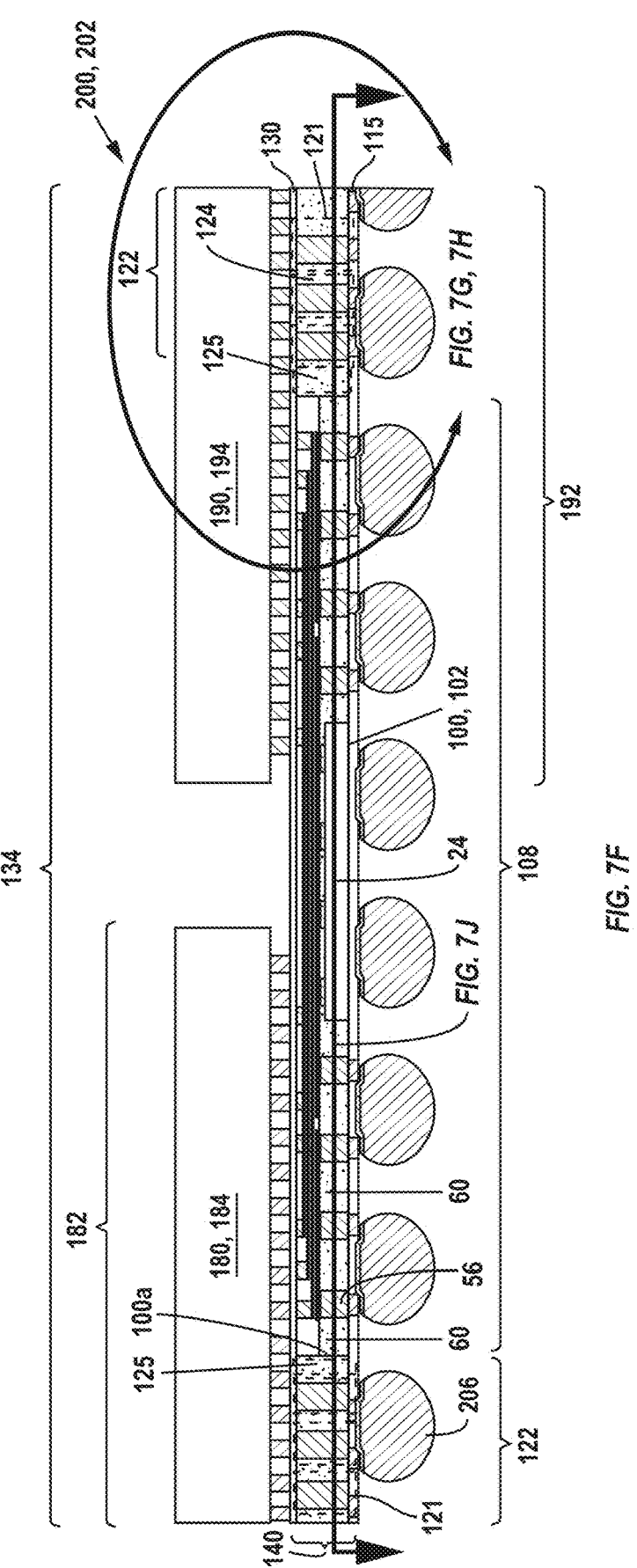
Figure 7G:
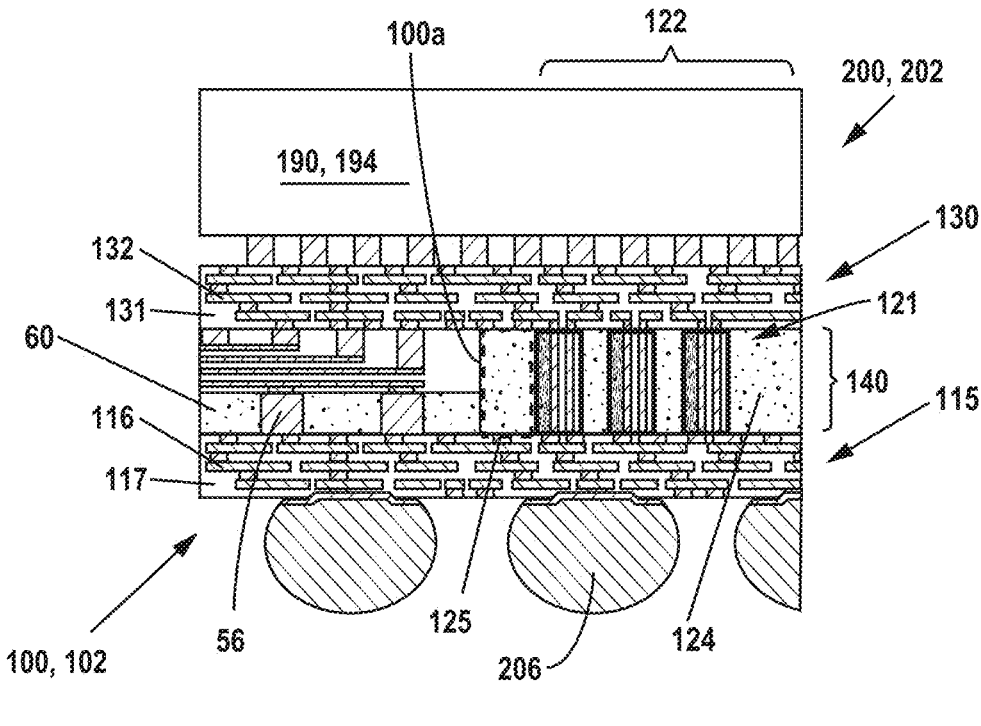
FIGS. 7G-7H illustrate close-up views of the right side of the electronic assembly of FIG. 7F showing through conductive interconnects replaced by 3D blocks disposed such that conductive layers within the 3D blocks 121 are in a vertical configuration.
Figure 7H:
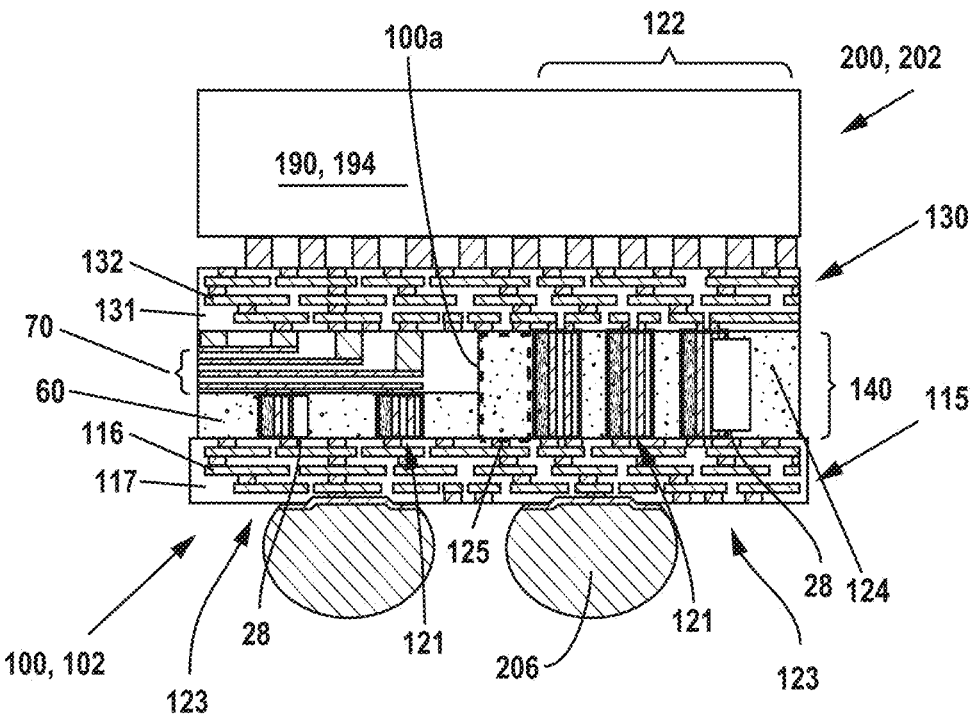

FIG. 7F, illustrates an embodiment of electronic assembly 200, 202 comprising a chip 24 disposed in molded bridge 102, further depicting replacing the through conductive interconnects 120 of the molded base 140, with 3D blocks 121, as shown in the enlarged view of FIGS. 7G and 7H. Replacing the through conductive interconnects 120 with 3D blocks 121 vertically disposed beneath second build-up interconnect structure 130 provides the benefit of finer pitch and higher density routing and vertical interconnect structures.

Similar to what is shown in FIGS. 7B and 7D, as shown in FIGS. 7E-7G, encapsulant margin 125 of the second encapsulant 124 may be located between the edge of the build-up interconnect structure 70 and the edge 100a of the molded bridge 100, and the periphery 122 of the molded bridge mounting sites 114. Further illustrated in FIG. 7F is molded bridge footprint 108, corresponding to a footprint of the first build up interconnect structure 70, also depicting first device 180 and second device 190. FIGS. 7G and 7H, included and discussed further below, illustrate cross-sectional side views of various embodiments of electronic assemblies 200, 202, and 204 being formed, as taken along detail line labeled FIGS. 7G and 7H of FIG. 7F.

FIG. 7G, illustrates a close-up view of the right side of the electronic assembly 202 of FIG. 7F, as indicated by the detail mark, further showing the through conductive interconnects 120 replaced by 3D blocks 121, which are disposed such that conductive layers within the 3D blocks 121 are in a vertical configuration. Second encapsulant 124 is disposed around the 3D blocks 121 and forming encapsulant margin 125 between edge 100a of molded bridge 100, 102 and a center facing edge of 3D blocks 121. Further depicted is lower base build-up interconnect structure 115 (as shown in FIG. 2D), comprising redistribution layers (RDLs) 116 and dielectric layers 117 interleaved with the RDLs 116 as part of lower base build-up interconnect structure 115. Second build-up interconnect structure 130, comprising redistribution layers (RDLs) 132 and dielectric layers 131, are further illustrated interleaved together and disposed over the molded base 140 including the molded bridge 100, 102. As shown by FIGS. 7G and 7H, conductive layers within the 3D blocks 121 and exposed at opposing ends may be coupled to conductive RDLs 116 and (or) RDLs 132 of the lower base build-up interconnect structure 115 and second build-up interconnect structure 130.

FIG. 7H, similar to FIG. 7G, illustrates a close-up view of the right side of the electronic assembly 202 of FIG. 7F, as indicated by the detail mark, further showing component 28 located proximal to 3D blocks 121 as part of molded base 140. In some embodiments, component 28 may be formed as part of, integral to, or disposed within, 3D blocks 121. In some embodiments, component 28 may comprise any type of off the shelf electronic component, such as capacitors, resistors, and the like. In other embodiments, component 28 may comprise an integrated passive device (IPD), a buffer, a retimer, a filter, a voltage regulator and any other like component as disclosed elsewhere in this disclosure. In particular embodiments, component 28 may comprise a DTC. In embodiments where component 28 comprises a capacitor or a DTC, component 28 may advantageously be disposed in close proximity to either or both of the first device 180 or second device 190 to provide local power supply. Such a configuration overcomes limitations of previous assemblies where proximity to the first or second devices limited the availability of local power and thus limited performance. Other benefits may be realized by either or both of the first device 180, 184 or second device 190, 194 having component 28 in close proximity, dependent upon the functionality of component 28. A further benefit of including components 28 as part of the assembly 202 is overcoming the challenge experienced by fabless companies in locating foundries willing to fabricate silicon bridges by enabling the combination of any number of off the shelf components, such as capacitors and other types of components, at many levels within the assemblies 200, 202, 204. Using the disclosed methods and assemblies as disclosed herein enables a "build your own" approach, combining silicon, MDx™ technology, or the build-up interconnect structure 70 comprising dielectric layers 74 such as polyimide as disclosed herein, within the same packaging foundry. Further illustrated in FIG. 7H are a plurality of reduced height 3D blocks 123, which may be similar to or the same as the earlier disclosed 3D blocks 121, disposed in a vertical orientation, similar to the positioning of through conductive interconnects 120, disposed in a periphery of the molded bridge 100 as earlier shown and described. The reduced height 3D blocks 123 allow for positioning of the first build-up interconnect structure 70 between the reduced height 3D blocks 123 and the second build-up interconnect structure 130, thus providing higher density routing and electrical performance to the assembly 202.

Figure 7I:
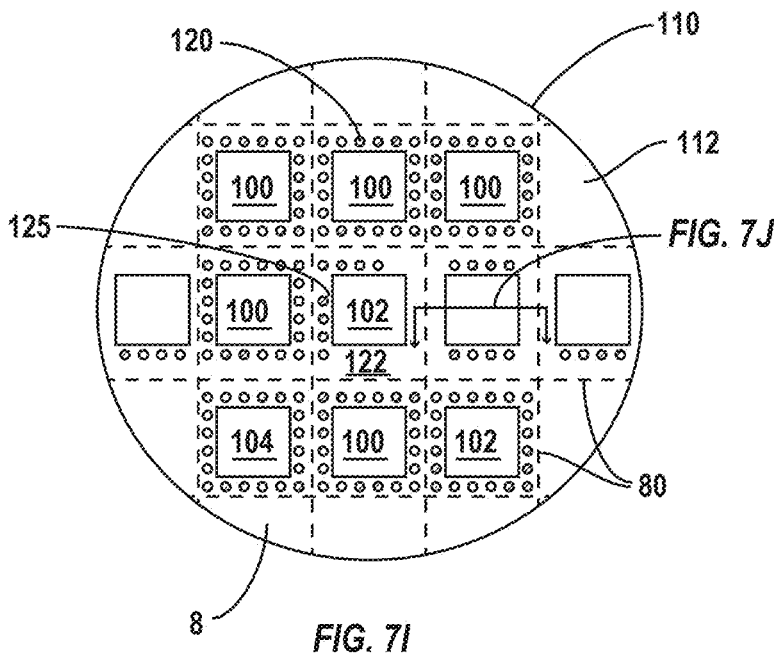
FIG. 7I illustrates a top or plan view similar to that of FIGS. 6A and 6B, depicting where one or more instances of molded bridges 100, 102 and 104 have been disposed over the molded bridge mounting sites.
Figure 7J:
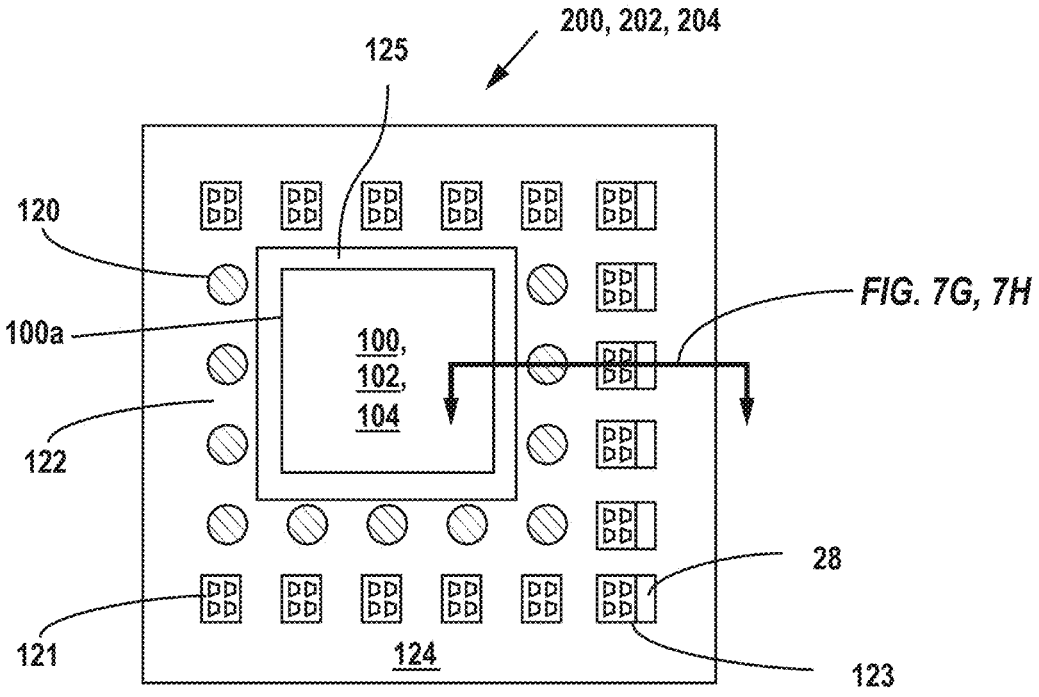
FIG. 7J illustrates the detail line 7J shown in FIG. 7I, illustrating a close-up plan view of FIG. 7I depicting electronic assemblies comprising instances of molded bridges comprising at least one component or chip, and molded bridges without a component or chip.

FIG. 7I, illustrates a top or plan view similar to that of FIGS. 6A and 6B, depicting where a plurality of one or more instances of molded bridges 100, 102 and 104 have been disposed over the molded bridge mounting sites 114, 114a, 114b of FIGS. 6A and 6B. Further illustrated is encapsulant margin 125 disposed between edge 100a of molded bridges 100, 102, 104 and through conductive interconnects 120, as detailed in FIG. 7J following. FIG. 7J, included and discussed further below, illustrates a plan view of an embodiment of electronic assemblies 200, 202, and 204, as taken along detail line labeled FIG. 7J.

FIG. 7J, illustrates the detail line 7J shown in FIG. 7I, illustrating a close-up plan view of FIG. 7I, depicting electronic assemblies 200, 202, and 204 comprising instances of molded bridges 100, including molded bridge 102 comprising at least one component or chip 24, and molded bridge 104 without a component or chip 24. The electronic assemblies 200, 202, and 204 may further comprise one or more of through conductive interconnects 120, vertical interconnect blocks (VIBs) 121, components 28, and reduced height 3D blocks 123 in various combinations, or alone, based upon design. In some instances, one or more of the vertical interconnect blocks (VIBs) 121 and reduced height 3D blocks 123 may comprise components 28 as shown. One or more of the through conductive interconnects 120, vertical interconnect blocks (VIBs) 121, components 28, and reduced height 3D blocks 123 may be coupled to the lower base build-up interconnect structure 115, as depicted in FIGS. 7G and 7H and others. FIG. 7J further illustrates encapsulant margin 125 (depicted for simplicity as a geometric channel) disposed between edge 100a of molded bridges 100, 102, 104 and through conductive interconnects 120 which are disposed in the periphery 122 of the mounting sites 114, 114a, 114b. Second encapsulant 124 is shown directly contacting one or more of the through conductive interconnects 120, vertical interconnect blocks (VIBs) 121 and reduced height 3D blocks 123. Shown by the plan view of FIG. 7J is a cross-sectional view of vertically oriented conductive traces within the 3D blocks 121, 123.

FIG. 8 illustrates an electronic assembly 204 comprising a molded bridge 104 formed without a chip 24, further depicting an edge 208 of the electronic assembly 200, 202, 204. Shown are a first device 180 and second device 190, disposed over a second build-up interconnect structure 130. Footprints 182 and 192 of the first device 180 and second device 190 may be partially over the molded bridge 100, 104, and partially over the through conductive interconnects 120. In some instances, build-up interconnect structures 70, as shown in FIGS. 2D and 4B, may comprise an embedded build-up interconnect structure 70. Accordingly, the molded bridge 104 may comprise an embedded build-up interconnect structure 70 that is an embedded component comprising one or more build-up interconnect structures 70 in place of a chip 24. The molded bridge 104 has a molded bridge footprint 108 as further shown in FIGS. 9A-9C following. In one embodiment, the embedded build-up interconnect structure 70 may comprise one or more dielectric layers 74 and one or more conductive routing layers 72 interleaved with the plurality of dielectric layers, similar to that described for first build-up interconnect structure 70 as described and depicted in FIGS. 2D-3E and 4B above. In particular embodiments, the embedded build-up interconnect structure 70 may comprise dielectric layers 74 comprising polyimide. In other embodiments, the embedded build-up interconnect structure 70 may comprise a plurality of molded encapsulant layers 62 and a plurality of conductive routing layers 72 comprising direct contacts 73 (under the trademark MDx™ as described above) interleaved with the plurality of molded encapsulant layers 62, similar to that described for first build-up interconnect structure 70 as described and depicted in FIGS. 4A-5B above. The embedded build-up interconnect structure 70 may be directly coupled to vertical interconnects 56 and disposed within the first encapsulant 60. Vertical interconnects 56 may be disposed within a footprint 108 of the embedded build-up interconnect structure 70.

FIG. 9A depicts an electronic assembly 204 comprising a plurality of molded bridges 100, 104, each formed without a chip 24. Similar to FIG. 8, the molded bridges 104 each comprises one or more embedded build-up interconnect structures 70 that comprises an embedded component in place of a chip 24 and provides a low impedance vertical connection such that TSVs are not required as part of the molded bridges 100, 102, 104 and electronic assemblies 200, 202, 204, but may be included as needed based on design. While the embodiment of FIG. 9A depicts an embedded build-up interconnect structure 70, a POSA would understand embedded build-up interconnect structure 70 as including the disclosure as shown and described for FIGS. 2D and 4B, and related disclosure herein. The electronic assembly 204 may further comprise a first device 180, and at least one second device 190. In a particular embodiment, first device 180 comprises a system on chip (SOC) device 184, and the at least one second device 190 comprises a memory device 194 which may comprise a high-bandwidth memory (HBM) device.

Figure 9B:
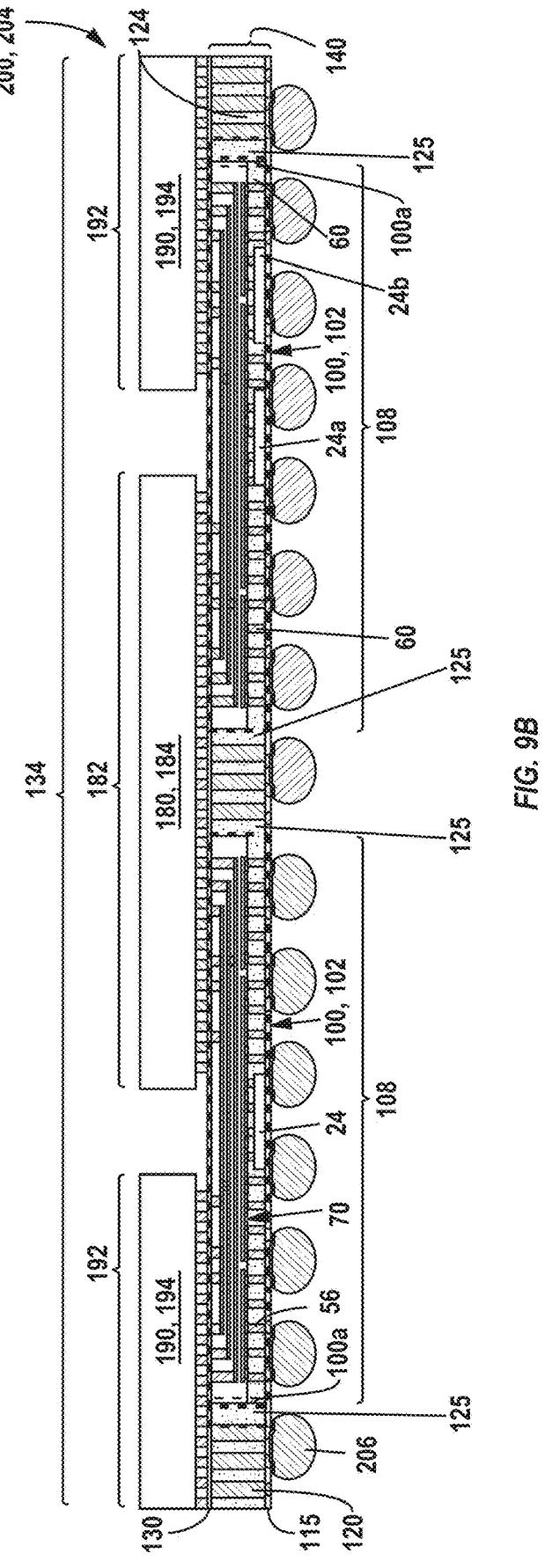

FIG. 9B, illustrates a similar electronic assembly 202 to that of FIG. 9A, where the plurality of molded bridges 102 of the electronic assembly 202 are each formed with at least a first chip 24a and a second chip 24b.

Figure 9C:
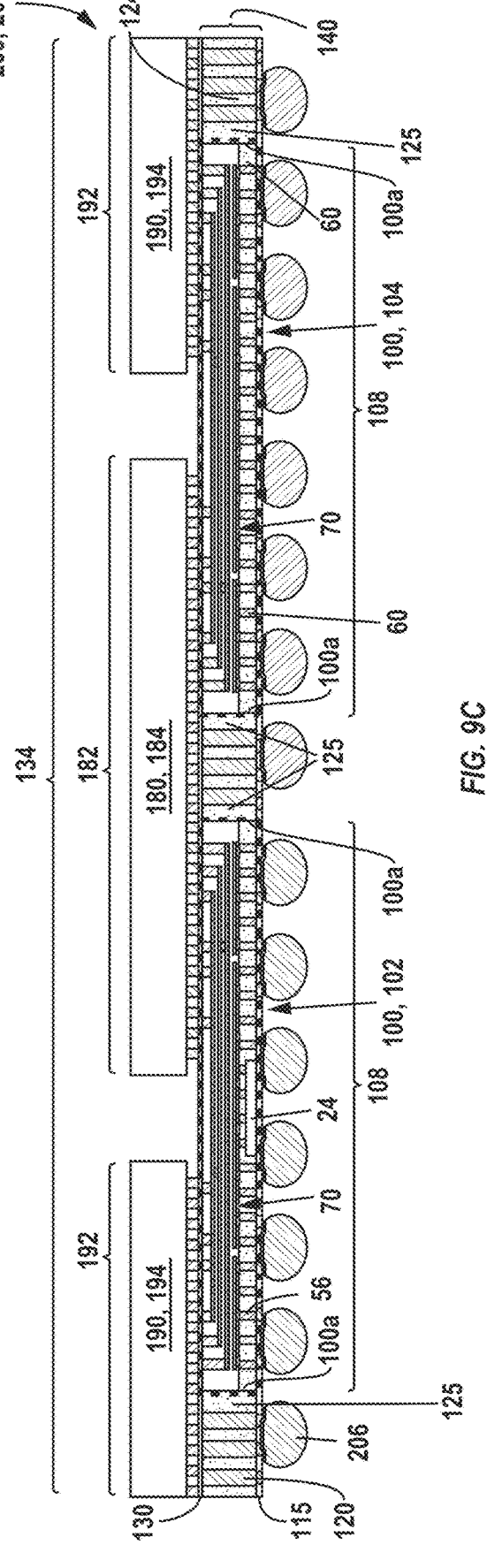

FIG. 9C, shows an electronic assembly 200, 204 comprising a molded bridge 104 having an embedded build-up interconnect structure 70 that is an embedded component comprising one or more build-up interconnects 70 in place of a chip 24, further comprising a molded bridge 102 including at least one chip 24a. The one or more build-up interconnects 70 may comprise one or more dielectric layers

74 comprising polyimide or other polymers, inorganic dielectrics, or encapsulant materials as described with respect to at least FIGS. 2D, 4B and 8, interleaved with one or more conductive layers 72, as disclosed herein.

Figure 9D:
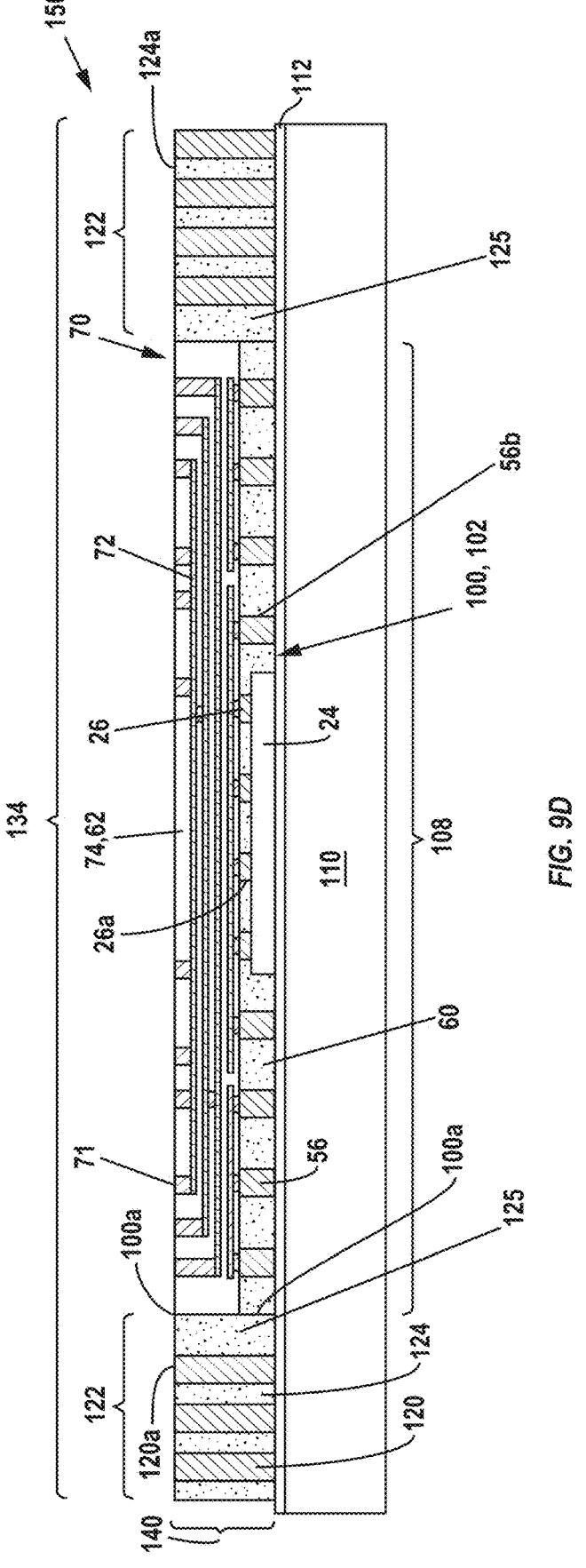
FIG. 9D illustrates an instance of a molded vertical interposer comprising a molded bridge including a chip or component, the interposer formed without redistribution layers.

FIG. 9D is similar to molded base 140 as shown in FIG. 7B, but depicts a molded vertical interposer 150 which is formed without lower base build-up interconnect structure 115 and second build-up interconnect structure 130. The molded vertical interposer 150 is similar to what is shown and described for molded base 140, and further comprises a planarized surface 124a of second encapsulant 124, and planarized ends 120a of through conductive interconnects 120 which may be exposed by a grinding or planarization process as disclosed herein, for later electrical interconnection and RDL deposition. In some instances, both sides of molded vertical interposer 150 may be planarized for later electrical interconnection and RDL deposition. While the embodiment of FIG. 9D depicts a chip or component 24, a POSA would understand that the molded vertical interposer 150 may be similarly formed without a chip 24.

Figure 9E:
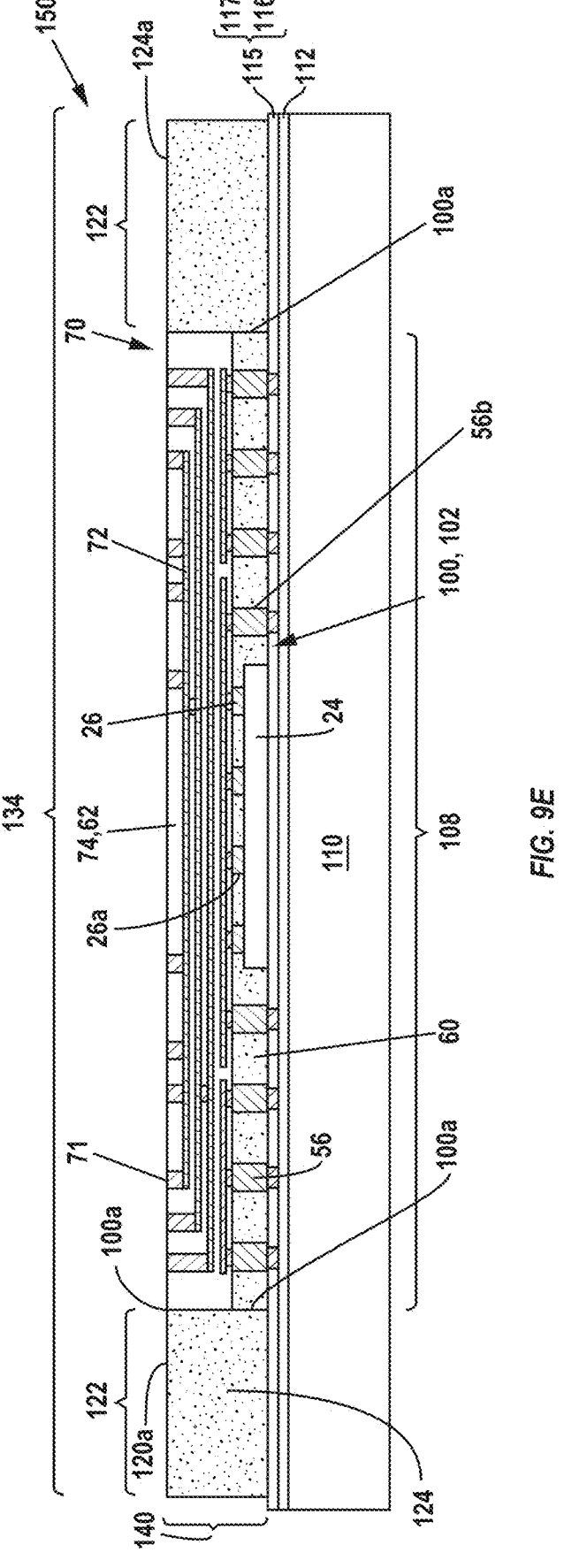
FIG. 9E illustrates an instance of a molded interposer formed without through conductive interconnects disposed in a periphery of the molded bridge and having a single redistribution layer of a lower base build-up interconnect structure.

FIG. 9E illustrates a molded interposer 160 formed with lower base build-up interconnect structure 115 coupled to second encapsulant 124 disposed around the molded RDL bridge and in a periphery 122 of the molded interposer 160. FIG. 9E differs from FIG. 9D by the periphery 122 comprising second encapsulant 124, without through conductive interconnects 120 disposed therein. Edges 100a of molded bridges 100, 102, 104 define an encapsulant defined border between first encapsulant 60 of the molded bridges 100, 102, 104 and the second encapsulant 124. In some embodiments, edges 100a further define a border or boundary between dielectric layers 74 (comprising a polymer, BCB, PBO or polyimide) or 62 of first build-up interconnect structure 70 and second encapsulant 124, as shown similarly in the plan view of FIG. 7J, but here without conductive interconnects 120. In embodiments where build-up interconnect structure 70 comprises one or more encapsulant layers 62 (as shown in at least FIG. 4B), edges 100a may define an encapsulant defined border between the one or more encapsulant layers 62 of build-up interconnect structure 70 and second encapsulant 124.

While embodiments of the electronic assemblies 200 as disclosed herein may be depicted in some figures as comprising a first build-up interconnect structure 70 comprising dielectric layers 74 such as polyimide (PI), and in other figures dielectric layers 62 comprising molded encapsulant layers (under the trademark MDx™ as described herein), a POSA would understand that the first build-up interconnect structure 70 refers collectively to either of dielectric layers 74 comprising polyimide or other polymer, or dielectric layers 62 comprising encapsulants. Similar reasoning applies to the embedded build-up interconnect structure 70, which may comprise dielectric layers 74 such as polyimide (PI), and dielectric layers 62 comprising molded encapsulant layers. Specific embodiments of the first build-up interconnect structure 70 may be selected according to design, cost, performance, and other requirements of the final electronic assembly.

At least some of the above advantages are available at least in part by using unit specific patterning for the build-up interconnect structures such as a frontside build-up interconnect structure 70, which is also known under the trademark "Adaptive Patterning," referred to as "AP." Unit specific patterning: (i) allows for the use of high-speed chip attach for semiconductor chips and AP will ensure alignment for high density interconnects with the molded direct contact interconnect structures. Adaptive Patterning may also be used in the herein disclosed processes for manufacturing electronic assemblies comprising embedded and stacked components and other packages including the ability to make large area connections which are precisely aligned to chip bond pads for very low contact resistance.

While this disclosure includes a number of embodiments in different forms, the drawings and written descriptions present detail of particular embodiments with the understanding that the present disclosure is to be considered as an exemplification of the principles of the disclosed methods and systems, and is not intended to limit the broad aspect of the disclosed concepts to the embodiments illustrated. Additionally, it should be understood by those of ordinary skill in the art that other manufacturing devices and examples could be intermixed or substituted with those provided. In places where the description above refers to particular embodiments, it should be readily apparent that a number of modifications may be made without departing from the spirit thereof and that these embodiments and implementations may be applied to other technologies as well. Accordingly, the disclosed subject matter is intended to embrace all such alterations, modifications and variations that fall within the spirit and scope of the disclosure and the knowledge of one of ordinary skill in the art.

What is claimed is:

1. An electronic assembly comprising:
    a molded bridge comprising a first encapsulant and a first build-up interconnect structure disposed over and coupled to the first encapsulant, wherein the first build-up interconnect structure comprises a plurality of dielectric layers interleaved with one or more conductive routing layers;
    through conductive interconnects offset from at least one edge of the molded bridge;
    a second encapsulant disposed over the molded bridge and around the through conductive interconnects to form a molded base, wherein the second encapsulant further comprises an encapsulant margin of the second encapsulant disposed around a perimeter of the first build-up interconnect structure and laterally disposed between edges of the molded bridge and the through conductive interconnects;
    a second build-up interconnect structure comprising redistribution layers (RDLs) disposed over the second encapsulant to form a molded interposer, wherein a footprint of the second build-up interconnect structure is larger than, and includes all of, a footprint of the first build-up interconnect structure;
    a first device disposed over the second build-up interconnect structure, wherein a footprint of the first device is partially over the molded bridge and partially over the through conductive interconnects; and
    a second device disposed over the second build-up interconnect structure, wherein a footprint of the second device is partially over the molded bridge and partially over the through conductive interconnects.

2. The electronic assembly of claim 1, wherein the molded bridge further comprises one or more of the following:
    the first build-up interconnect structure comprising conductive traces contacting polyimide;
    the first build-up interconnect structure comprising conductive traces with the first encapsulant contacting four sides of the conductive traces;
    the first build-up interconnect structure coupled with a component within the molded bridge;
    the first build-up interconnect structure without being coupled to a component within the molded bridge;

the first build-up interconnect structure coupled to a plurality of vertical interconnects within the molded bridge; and
    the first build-up interconnect structure coupled to the first encapsulant without being coupled to through conductive interconnects.

3. The electronic assembly of claim 2, wherein:
    the plurality of vertical interconnects and the through conductive interconnects comprise copper; and
    the through conductive interconnects comprise a height in a range of 20-100 micrometers ($\mu$m) and a cross-sectional thickness in a range of 3-20 $\mu$m.

4. The electronic assembly of claim 1, wherein the molded bridge comprises a component and the component comprises one or more of: a semiconductor chip, a chiplet, an active device, an integrated circuit (IC), a passive device, an integrated passive device (IPD), a deep trench capacitor (DTC), a transformer, a voltage regulator, a power management IC (PMIC), a filter, a switch, an amplifier, an interface, a repeater or a retimer, a clock, a processor, a controller, an accelerator, a memory, a non-volatile memory (NVM), a bridge, a silicon bridge, a MEMS device, an optical device, an opto-electronic device, a cache and a buffer.

5. The electronic assembly of claim 1, wherein the molded bridge comprises:
    a centrally located chip with vertical interconnects disposed around a periphery of the centrally located chip such that the vertical interconnects are disposed along an edge of the molded bridge; or
    centrally located vertical interconnects with components disposed around a periphery of the vertical interconnects such that the components are disposed at an edge of the molded bridge.

6. The electronic assembly of claim 1, wherein the through conductive interconnects of the molded base comprise vertical interconnect blocks (VIBs).

7. The electronic assembly of claim 1, wherein the electronic assembly comprises unit specific patterning such that a first misalignment between an edge of the molded bridge and an edge of the electronic assembly is greater than a second misalignment between either the molded bridge and the first build-up interconnect structure or the first build-up interconnect structure and the second build-up interconnect structure.

8. The electronic assembly of claim 1, wherein the molded bridge comprises two or more components.

9. The electronic assembly of claim 1, wherein the first build-up interconnect structure comprises an additional encapsulant sandwiched between the plurality of dielectric layers interleaved with the plurality of conductive routing layers, wherein:
    a first set of the plurality of dielectric layers interleaved with the plurality of conductive routing layers is disposed over the first encapsulant;
    an additional encapsulant is disposed over the first set of the plurality of dielectric layers interleaved with the plurality of conductive routing layers; and
    a second set of the plurality of dielectric layers interleaved with the plurality of conductive routing layers is disposed over the additional encapsulant.

10. The electronic assembly of claim 1, wherein one or more of the first build-up interconnect structure and the second build-up interconnect structure and a lower base build-up interconnect structure comprises one or more planes of one or more thicknesses for signal, ground, and power.

11. The electronic assembly of claim 1, wherein:

the first device comprises a system on chip (SOC); and the second device comprises a memory or high-bandwidth memory (HBM) device.

12. The electronic assembly of claim 1, wherein the molded bridge does not comprise through silicon vias (TSVs).

13. An electronic assembly comprising:

a molded bridge comprising:

an embedded component disposed within a first encapsulant;

vertical interconnects disposed within the first encapsulant and around the embedded component;

electrical interconnect structures disposed within the first encapsulant and over the embedded component and electrically coupled to the embedded component;

a first build-up interconnect structure disposed over the first encapsulant and within a second encapsulant, the first build-up interconnect structure comprising one or more first dielectric layers interleaved with one or more first conductive layers;

a second build-up interconnect structure disposed over the first build-up interconnect structure, over the first encapsulant and within a third encapsulant, the second build-up interconnect structure comprising one or more second dielectric layers interleaved with one or more second conductive layers; and a plurality of devices disposed over the second build-up interconnect structure.

14. The electronic assembly of claim 13, wherein the component comprises one or more of: a semiconductor chip, a chiplet, an active device, an integrated circuit (IC), a passive device, an integrated passive device (IPD), a deep trench capacitor (DTC), a transformer, a voltage regulator, a power management IC (PMIC), a filter, a switch, an amplifier, an interface, a repeater or a retimer, a clock, a processor, a controller, an accelerator, a memory, a non-volatile memory (NVM), a bridge, a silicon bridge, a MEMS device, an optical device, an opto-electronic device, a cache and a buffer.

15. The electronic assembly of claim 13, wherein the electrical interconnect structures comprise as at least one of a column, a pillar, a posts, a redistribution layer (RDL), a bump or a stud.

16. The electronic assembly of claim 13, further comprising vertical interconnects disposed around a periphery of the component, wherein the vertical interconnects are disposed at, along, or adjacent an edge of the molded bridge.

17. The electronic assembly of claim 13, further comprising:

through conductive interconnects offset from at least one edge of the molded bridge, and the plurality of devices comprise:

a first device disposed over the second build-up interconnect structure, wherein a footprint of the first device is partially over the molded bridge and partially over the through conductive interconnects; and a second device disposed over the second build-up interconnect structure, wherein a footprint of the second device is partially over the molded bridge and partially over the through conductive interconnects.

18. The electronic assembly of claim 13, further comprising unit specific patterning such that a first misalignment between the at least one edge of the molded bridge and an edge of the electronic assembly is greater than a second misalignment between the at least one edge of the molded bridge and an edge of the first build-up interconnect structure or the at least one edge of the molded bridge and an edge of the second build-up interconnect structure.

19. A molded bridge for an electronic assembly, the molded bridge comprising:

an embedded component disposed within a first encapsulant;

vertical interconnects disposed within the first encapsulant and around the embedded component;

electrical interconnect structures disposed within the first encapsulant and over the embedded component and electrically coupled to the embedded component;

a first build-up interconnect structure disposed over the first encapsulant and within a second encapsulant, the first build-up interconnect structure comprising one or more first dielectric layers interleaved with one or more first conductive layers; and a second build-up interconnect structure disposed over the first build-up interconnect structure, over the first encapsulant and within a third encapsulant, the second build-up interconnect structure comprising one or more second dielectric layers interleaved with one or more second conductive layers, wherein at least one edge of the molded bridge is configured to be offset from an edge of a device of the electronic assembly.

20. The electronic assembly of claim 19, wherein the component comprises one or more of: a semiconductor chip, a chiplet, an active device, an integrated circuit (IC), a passive device, an integrated passive device (IPD), a deep trench capacitor (DTC), a transformer, a voltage regulator, a power management IC (PMIC), a filter, a switch, an amplifier, an interface, a repeater or a retimer, a clock, a processor, a controller, an accelerator, a memory, a non-volatile memory (NVM), a bridge, a silicon bridge, a MEMS device, an optical device, an opto-electronic device, a cache and a buffer.

21. The electronic assembly of claim 19, further comprising vertical interconnects disposed around a periphery of the component, wherein the vertical interconnects are disposed at, along, or adjacent an edge of the molded bridge.

* * * * *